US012131798B2

(12) United States Patent
Ko et al.

(10) Patent No.: US 12,131,798 B2
(45) Date of Patent: Oct. 29, 2024

(54) NON-VOLATILE MEMORY DEVICE FOR DETECTING DEFECTS OF BIT LINES AND WORD LINES

(71) Applicant: SAMSUNG ELECTRONICS CO., LTD., Suwon-si (KR)

(72) Inventors: Junyoung Ko, Suwon-si (KR); Sangwan Nam, Suwon-si (KR); Youse Kim, Suwon-si (KR); Heewon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 17/972,300

(22) Filed: Oct. 24, 2022

(65) Prior Publication Data

US 2023/0144141 A1 May 11, 2023

(30) Foreign Application Priority Data

Nov. 10, 2021 (KR) .................. 10-2021-0154255
May 16, 2022 (KR) .................. 10-2022-0059814

(51) Int. Cl.
*G11C 7/10* (2006.01)
*G06F 11/10* (2006.01)

(52) U.S. Cl.
CPC ........ *G11C 7/1057* (2013.01); *G06F 11/1076* (2013.01)

(58) Field of Classification Search
CPC .......... G11C 7/1057; G11C 2029/1202; G11C 2029/1204; G11C 29/025; G11C 29/12; G06F 11/1076
See application file for complete search history.

(56) References Cited

U.S. PATENT DOCUMENTS 9,136,017 B2    9/2015   Tanzawa
9,390,809 B1    7/2016   Shur et al.
10,482,973 B2  11/2019   Lee et al.
(Continued)

FOREIGN PATENT DOCUMENTS

KR    10-2011-0001071 A    1/2011
KR    10-2019-0054720 A    5/2019

OTHER PUBLICATIONS

Communication issued Jun. 28, 2023, by the European Patent Office in European Application No. 22206068.3.

*Primary Examiner* — Ajay Ojha
(74) *Attorney, Agent, or Firm* — Sughrue Mion, PLLC

(57) ABSTRACT

Provided is a non-volatile memory device. The non-volatile memory device includes: a memory cell array including cell strings, each including memory cells respectively connected to word lines; a page buffer circuit including page buffers respectively connected to the memory cells through bit lines, wherein a first page buffer is connected to a first cell string through a first bit line; a control logic circuit configured to control a pre-sensing operation to disconnect the first bit line and the first cell string from each other during a pre-sensing period for detecting a defect of the first bit line and control a post-sensing operation to connect the first bit line and the first cell string to each other in a post-sensing period for detecting defects of the word lines and the first bit line; and a defect detection circuit configured to detect defects of the word lines based on the sensing operations.

20 Claims, 17 Drawing Sheets

(56) References Cited

U.S. PATENT DOCUMENTS

| | | |
|---|---|---|
| 2004/0022092 A1 | 2/2004 | Dvir et al. |
| 2007/0170520 A1* | 7/2007 | Zhang ................ H01L 27/105 |
| | | 257/E21.666 |
| 2012/0281471 A1 | 11/2012 | Hung et al. |
| 2013/0033948 A1* | 2/2013 | Braceras ............. G11C 29/025 |
| | | 365/201 |
| 2015/0117105 A1 | 4/2015 | Jung et al. |
| 2015/0287479 A1 | 10/2015 | Nam et al. |
| 2016/0071594 A1 | 3/2016 | Paudel et al. |
| 2017/0032849 A1 | 2/2017 | Park |

* cited by examiner

NON-VOLATILE MEMORY DEVICE FOR DETECTING DEFECTS OF BIT LINES AND WORD LINES

CROSS-REFERENCE TO RELATED APPLICATIONS

This application is based on and claims priority under 35 U.S.C. § 119 to Korean Patent Application Nos. 10-2021-0154255, filed on Nov. 10, 2021, and 10-2022-0059814, filed on May 16, 2022, in the Korean Intellectual Property Office, the disclosures of which are incorporated by reference herein in their entireties.

BACKGROUND

The present disclosure relates to a memory device, and more particularly, to a memory device for detecting defects of bit lines and word lines.

As the amount of data to be processed by electronic devices increases, memory devices with high capacity and high bandwidth are demanded. To improve the degree of integration of semiconductor memories, three-dimensional (3D) arrangement technology, in which a plurality of memory chips are stacked, has begun to be applied instead of two-dimensional (2D) arrangement technology.

In a 3D integrated circuit, in which memory cells are stacked three-dimensionally over a peripheral circuit for operating a semiconductor memory device, when a defect occurs in a semiconductor memory chip, the semiconductor memory chip malfunctions. Therefore, a test for detecting whether a defect has occurred and a test for detecting the cause of the defect may be performed.

Because there are numerous signals input or output from the inside of the peripheral circuit for the operation of the semiconductor memory device, it is difficult to detect or interpret by which signal a malfunction of the semiconductor chip is caused.

SUMMARY

The present disclosure provides a non-volatile memory device that prevents unrecoverable data from being generated through early detection of a progressive defect like a defect in a bit line or a word line.

According to an aspect of an example embodiment, a non-volatile memory device includes: a memory cell array including a plurality of cell strings, each including a plurality of memory cells respectively connected to a plurality of word lines; a page buffer circuit including a plurality of page buffers respectively connected to the plurality of memory cells through a plurality of bit lines, wherein a first page buffer from among the plurality of page buffers is connected to a first cell string from among the plurality of cell strings through a first bit line from among the plurality of bit lines; a control logic circuit configured to control a pre-sensing operation to disconnect the first bit line and the first cell string from each other during a pre-sensing period for detecting a defect of the first bit line and control a post-sensing operation to connect the first bit line and the first cell string to each other in a post-sensing period for detecting defects of the plurality of word lines and the first bit line; and a defect detection circuit configured to detect defects of the plurality of word lines based on a result of the pre-sensing operation and a result of the post-sensing operation.

According to an aspect of an example embodiment, a non-volatile memory device includes: a memory cell array provided in a first semiconductor layer and including a plurality of cell strings, each including a plurality of memory cells respectively connected to a plurality of word lines; a page buffer circuit provided in a second semiconductor layer and connected to each of a plurality of bit lines via through electrodes penetrating the first semiconductor layer and the second semiconductor layer, wherein the first semiconductor layer is provided on the second semiconductor layer; a control logic circuit provided in the second semiconductor layer, and configured to control a pre-sensing operation to disconnect the plurality of bit lines and the plurality of cell strings from each other during a pre-sensing period for detecting a defect of at least one of the plurality of bit lines and control a post-sensing operation to connect the plurality of bit lines and the plurality of cell strings in a post-sensing period for detecting defects of at least one of the plurality of word lines and the plurality of bit lines; and a defect detection circuit provided in the second semiconductor layer and configured to detect defects of the plurality of word lines based on a result of the pre-sensing operation and a result of the post-sensing operation.

According to an aspect of an example embodiment, a non-volatile memory device includes: a memory cell array including a first memory cell connected to a first word line and a second memory cell connected to a second word line; a page buffer circuit including a first page buffer connected to the first memory cell and a first cell string through a first bit line, and a second page buffer connected to the second memory cell and a second cell string through a second bit line; a control logic circuit configured to control a pre-sensing operation to disconnect the first bit line and the first cell string from each other during a pre-sensing period for detecting a defect of the first bit line and control a post-sensing operation to connect the first bit line and the first cell string in a post-sensing period for detecting defects of the first word line and the first bit line; and a defect detection circuit configured to detect defects of the first word line based on a result of the pre-sensing operation and a result of the post-sensing operation.

BRIEF DESCRIPTION OF THE DRAWINGS

The above and other objects and features will be more clearly understood from the following description, taken in conjunction with the accompanying drawings, in which.

DETAILED DESCRIPTION

Hereinafter, example embodiments are described with reference to the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
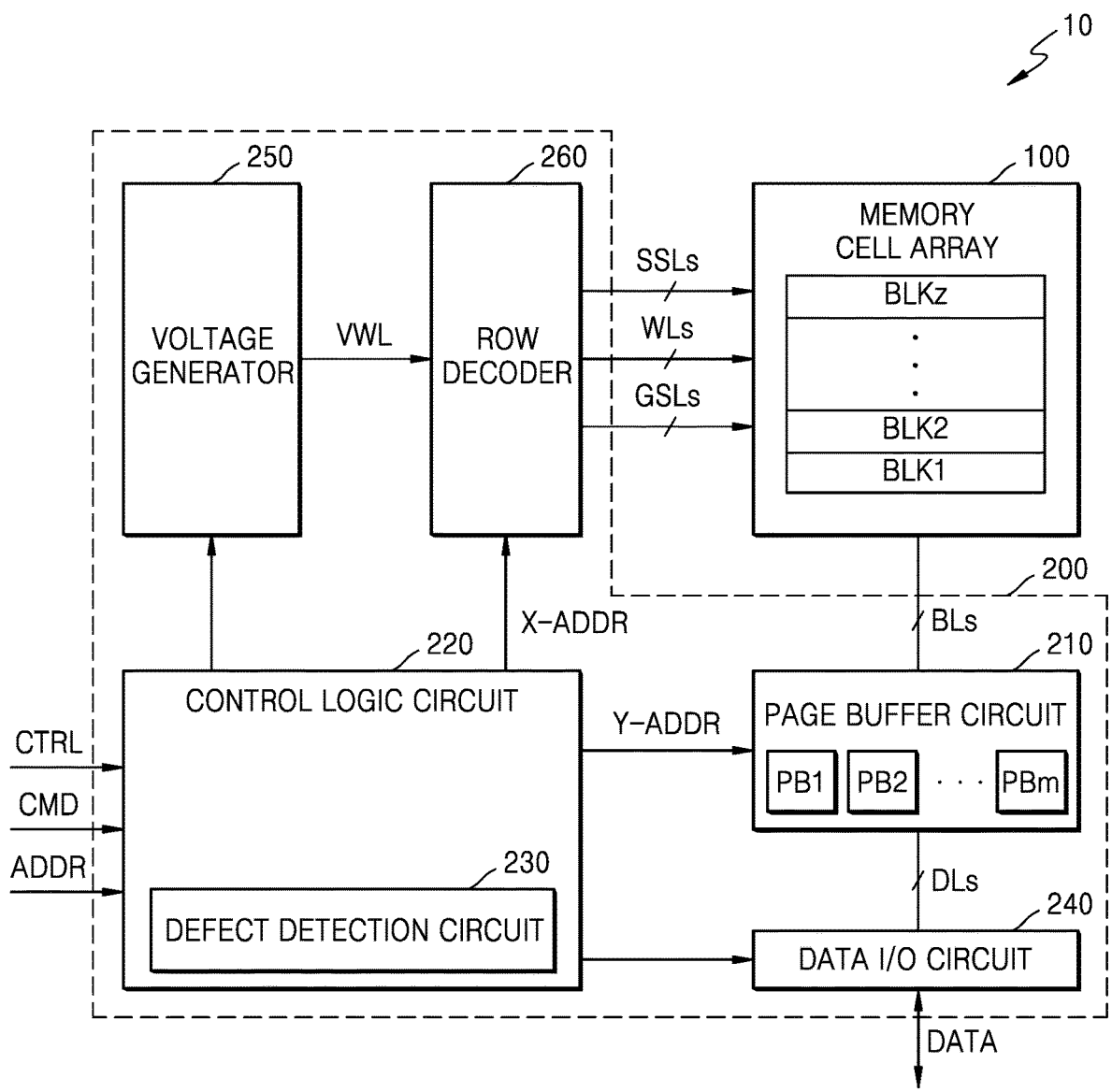
FIG. 1 is a block diagram showing a memory device according to an example embodiment.

FIG. 1 is a block diagram showing a memory device according to an example embodiment.

Referring to FIG. 1, a memory device 10 may include a memory cell array 100 and a peripheral circuit 200, and the peripheral circuit 200 may include a page buffer circuit 210, a control logic circuit 220, a data input/output circuit 240, a voltage generator 250, and a row decoder 260. The peripheral circuit 200 may further include a column logic, a pre-decoder, a temperature sensor, a command decoder, an address decoder, etc.

The memory cell array 100 may be connected to the page buffer circuit 210 through bit lines BLs and may be connected to the row decoder 260 through word lines WLs, string select lines SSLs, and ground select lines GSLs.

The memory cell array 100 may include a plurality of memory cells. For example, the memory cells may be flash memory cells. Hereinafter, example embodiments are described in detail based on an example where the memory cells are NAND flash memory cells. However, example embodiments are not limited thereto, and, in some example embodiments, the memory cells may be resistive memory cells like resistive RAM (ReRAM) cells, phase change RAM (PRAM) cells, ferroelectric RAM (FRAM) cells, and magnetic RAM (MRAM) cells.

In an example embodiment, the memory cell array 100 may include a three-dimensional memory cell array. The three-dimensional memory cell array may include a plurality of NAND strings, and each NAND string may include memory cells respectively connected to word lines vertically stacked on a substrate. However, example embodiments are not limited thereto. In some example embodiments, the memory cell array 100 may include a two-dimensional memory cell array, and the two-dimensional memory cell array may include a plurality of NANDs arranged in a row-wise direction and a column-wise direction.

The page buffer circuit 210 may include a plurality of page buffers PB1 to PBm, and the page buffers PB1 to PBm may be connected to memory cells through the bit lines BLs, respectively. The page buffer circuit 210 may select at least one bit line from among the bit lines BLs under control by the control logic circuit 220.

For example, during a program operation, the page buffer circuit 210 may apply a program bit line voltage corresponding to data DATA to be programmed to a selected bit line. During a read operation, the page buffer circuit 210 may sense data DATA stored in a memory cell by sensing a current or a voltage through the selected bit line. The page buffer circuit 210 may be configured to temporarily store data DATA to be programmed or data DATA read from a memory cell. For example, the page buffers PB1 to PBm may each include one or more latches, which may temporarily store data.

According to an example embodiment, the page buffers PB1 to PBm may each include one or more transistors and one or more latches related to an operation for temporarily storing data. For example, the page buffers PB1 to PBm may each perform a pre-charge operation on the bit lines BLs based on switching operations of one or more transistors, respectively, and, as a sensing node and a bit line BL is electrically connected, may sense data through the sensing node. Also, data stored in any one latch may be moved to another latch based on switching operations of transistors, and data to be written may be provided to the memory cell array 100 through the bit lines BLs or read data may be provided to the outside of the memory device 10 through the bit lines BLs.

The control logic circuit 220 may include a defect detection circuit 230. The defect detection circuit 230 may generate signals for controlling the page buffers PB1 to PBm, respectively. According to an example embodiment, the defect detection circuit 230 may generate control signals to control the page buffers PB1 to PBm based on different control timings, respectively. Generated control signals may include a pre-sensing signal and/or a post-sensing signal. For example, defects of one or more bit lines may be detected based on a generated pre-sensing signal, and defects of one or more bit lines and defects of one or more word lines may be detected based on a generated post-sensing signal. Detecting defects of one or more bit lines, detecting defects in one or more bit lines, and detecting defects of one or more word lines, based on a pre-sensing signal and a post-sensing signal, are described below in detail with reference to the drawings.

The control logic circuit 220 may output various control signals, e.g., a row address X_ADDR and a column address Y_ADDR, for writing or programming data to the memory cell array 100, read data from the memory cell array 100, or erase data stored in the memory cell array 100, based on a command CMD, an address ADDR, and a control signal CTRL. Therefore, the control logic circuit 220 may overall control various operations within the memory device 10.

The data input/output circuit 240 may provide data DATA received from a memory controller to the page buffer circuit 210 through data lines DLs or transmit data DATA received from the page buffer circuit 210 through the data lines DLs to the memory controller.

The voltage generator 250 may generate various types of voltages for performing a program operation, a read operation, and an erase operation on the memory cell array 100, based on a voltage control signal. In detail, the voltage generator 250 may generate a word line voltage, e.g., a program voltage, a read voltage, a pass voltage, an erase verify voltage, or a program verify voltage. Also, the voltage generator 250 may further generate a string select line voltage and a ground select line voltage, based on the voltage control signal. Also, the voltage generator 250 may generate one or more voltages for driving or controlling the page buffer circuit 210 according to example embodiments.

The row decoder 260 may select one of a plurality of memory blocks according to the row address X_ADDR, may select one of the word lines WLs of a selected memory block, and may select one of the string select lines SSLs. The page buffer circuit 210 may select at least some bit lines from among the bit lines BLs according to the column address Y_ADDR. In detail, the page buffer circuit 210 may operate as a write driver or a sense amplifier depending on an operation mode.

In addition, the memory device 10 shown in FIG. 1 may be referred to as a storage device. For example, the storage device is a device that stores data under control by a host device, such as a computer, a smartphone, or a smart pad. The storage device may be a device that stores data in a semiconductor memory, and more particularly, a non-volatile memory device, such as a solid state drive (SSD) or a memory card. The storage device may further include a controller for controlling the memory device 10, wherein the controller may control data storage and reading operations of the memory device 10 according to requests from a host device. For example, the command CMD, the address ADDR, and the control signal CTRL may be provided by the controller to the memory device 10.

Figure 2:
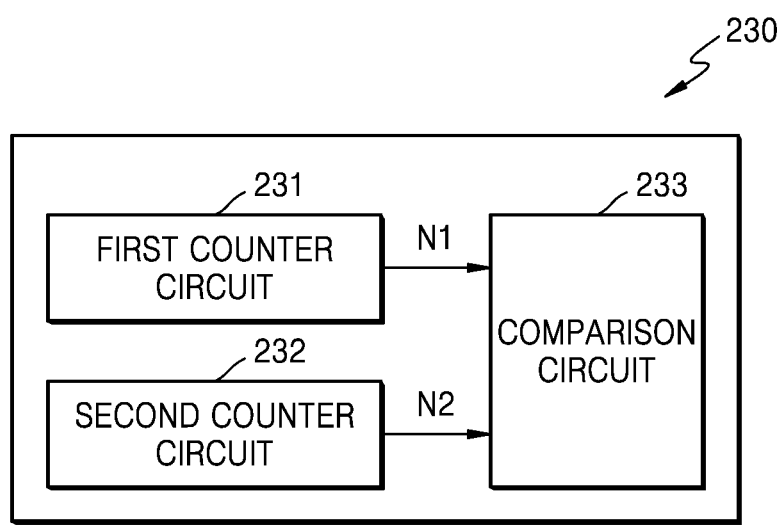
FIG. 2 is a block diagram showing configuration of a defect detection circuit according to an example embodiment.

FIG. 2 is a block diagram showing the configuration of the defect detection circuit 230 of FIG. 1.

Referring to FIG. 2, the defect detection circuit 230 may include a first counter circuit 231, a second counter circuit 232, and a comparison circuit 233.

The first counter circuit 231 may count the number of off-cells in a pre-sensing operation, and the second counter circuit 232 may count the number of off-cells in a post-sensing operation. However, example embodiments are not limited thereto. For example, the first counter circuit 231 may count the number of off-cells in a post-sensing operation, and the second counter circuit 232 may count the number of off-cells in a pre-sensing operation.

Here, pre-sensing may indicate controlling a bit line BL and a string select line SSL to not be connected to each other. As a result of pre-sensing, a defect of the bit line BL may be detected. Post-sensing may indicate controlling the bit line BL and the string select line SSL to be connected to each other. As a result of post-sensing, defects of the bit line BL and a word line may be detected.

The first counter circuit 231 may output a first value N1 obtained by counting the number of off-cells in the pre-sensing operation, and the second counter circuit 232 may output a second value N2 obtained by counting the number of off-cells in the post-sensing operation.

The comparison circuit 233 may receive the first value N1 and the second value N2, which are output values of the first counter circuit 231 and the second counter circuit 232, respectively. The comparison circuit 233 may compare the first value N1 with the second value N2. For example, when the first value N1 is greater than the second value N2, a corresponding memory block may be processed as a bad block (BB) to prevent unrecoverable data, thereby improving the data reliability of the memory device 10.

Figure 3:
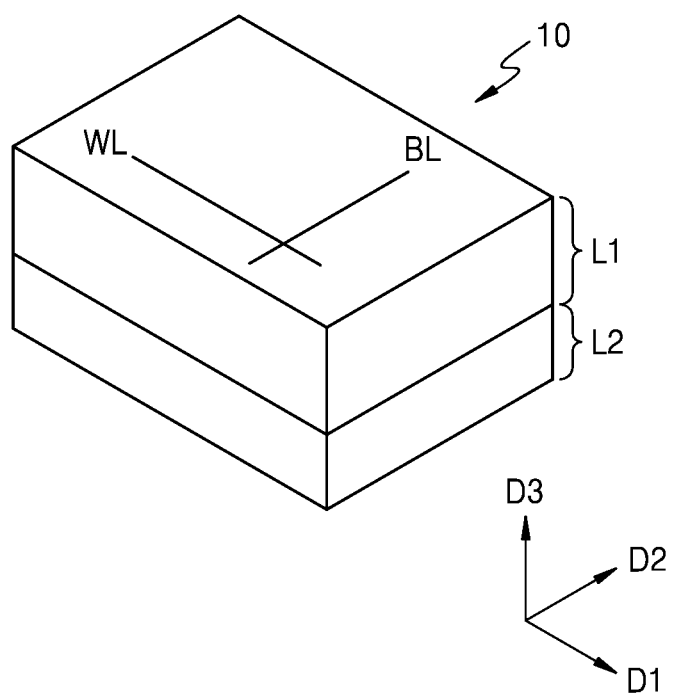
FIG. 3 is a diagram schematically showing structure of memory device according to an example embodiment.

FIG. 3 is a diagram schematically showing the structure of the memory device 10 of FIG. 1, according to an example embodiment.

Although FIG. 3 shows an example of a Cell Over Periphery (COP) structure as an implementation example of the memory device 10, example embodiments are not limited thereto, and the memory device 10 may be implemented in various structures.

Referring to FIG. 3, the memory device 10 may include a first semiconductor layer L1 and a second semiconductor layer L2, and the first semiconductor layer L1 may be stacked in a vertical direction (i.e., a third direction D3) with respect to the second semiconductor layer L2. In detail, the second semiconductor layer L2 may be disposed below the first semiconductor layer L1 in the third direction D3, and thus, the second semiconductor layer L2 may be disposed close to a substrate.

According to an example embodiment, the memory cell array 100 of FIG. 1 may be formed in the first semiconductor layer L1, and the peripheral circuit 200 of FIG. 1 may be formed in the second semiconductor layer L2. Therefore, the memory device 10 may have a structure in which the memory cell array 100 is disposed above the peripheral circuit 200, that is, the COP structure. The COP structure may effectively reduce a horizontal area and improve the degree of integration of the memory device 10.

According to an example embodiment, the second semiconductor layer L2 may include a substrate, and the peripheral circuit 200 may be formed in the second semiconductor layer L2 by forming transistors and metal patterns for wiring the transistors on the substrate. After the peripheral circuit 200 is formed in the second semiconductor layer L2, the first semiconductor layer L1 including the memory cell array 100 may be formed, and metal patterns for electrically connecting the word lines WL and the bit lines BL of the memory cell array 100 to the peripheral circuit 200 formed in the second semiconductor layer L2 may be formed. For example, the word lines WL may extend in a first direction D1, and the bit lines BL may extend in a second direction D2.

Figure 4:
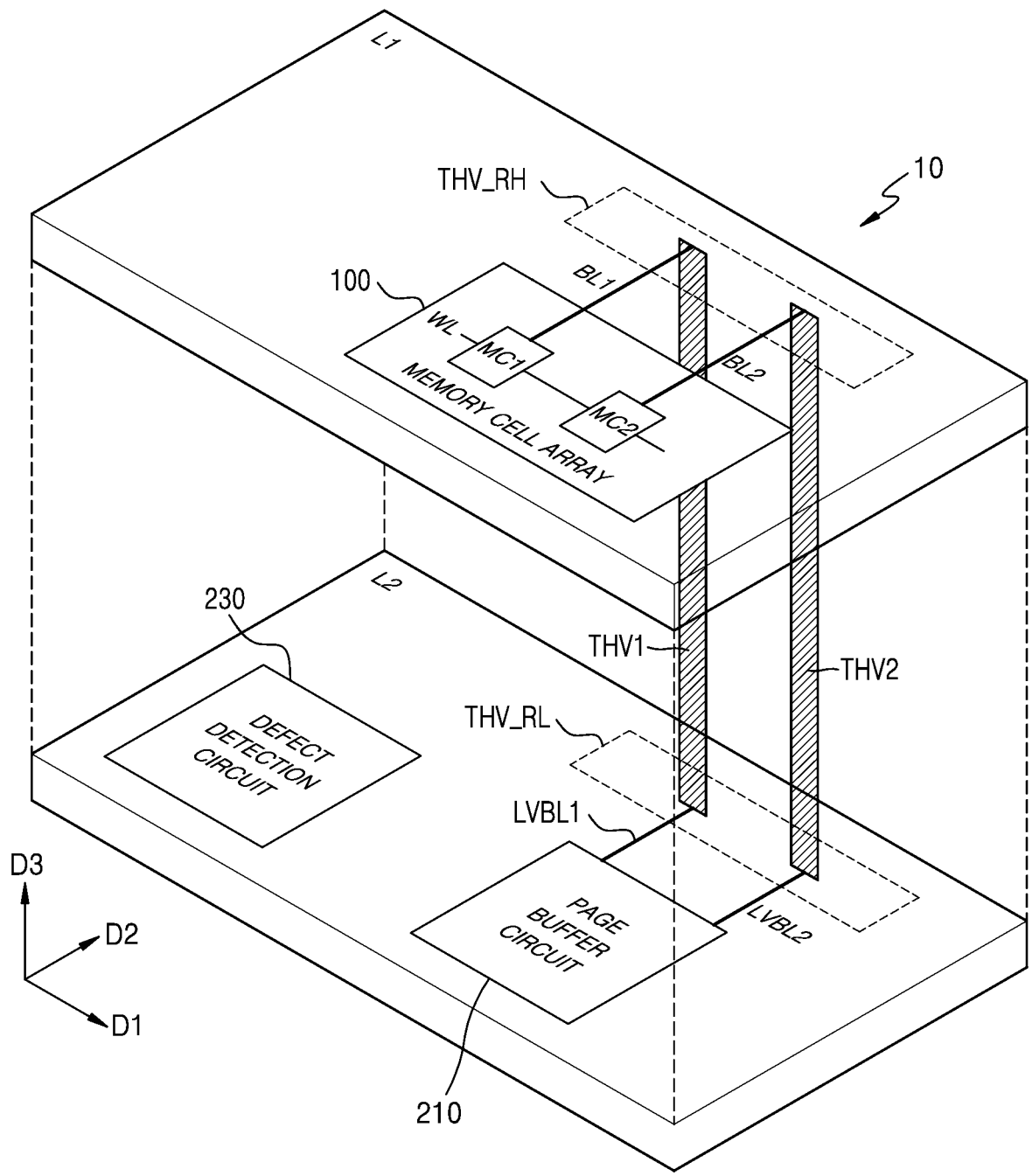
FIG. 4 is a diagram showing an example of a memory device according to an example embodiment.

FIG. 4 is a diagram showing an example of the memory device 10 of FIG. 3.

Referring to FIG. 4, a memory device 10 may include the memory cell array 100, the page buffer circuit 210, and the defect detection circuit 230. The memory cell array 100 may be formed in the first semiconductor layer L1, and the page buffer circuit 210 and the defect detection circuit 230 may be formed in the second semiconductor layer L2. The memory cell array 100, the page buffer circuit 210, and the defect detection circuit 230 may correspond to the memory cell array 100, the page buffer circuit 210, and the defect detection circuit 230 of FIG. 1, respectively.

The memory cell array 100 may include a plurality of memory cells including a first memory cell MC1 and a second memory cell MC2. The first memory cell MC1 and the second memory cell MC2 may be connected to the word lines WL. The first memory cell MC1 and the second memory cell MC2 may be connected to a first bit line BL1 and a second bit line BL2 formed in the first semiconductor layer L1, respectively.

The page buffer circuit 210 may be connected to a first lower bit line LVBL1 and a second lower bit line LVBL2 formed in the second semiconductor layer L2. The first bit line BL1 and the first lower bit line LVBL1 may be electrically connected to each other through a first through electrode THV1, and the second bit line BL2 and the second lower bit line LVBL2 may be electrically connected to each other through a second through electrode THV2. A first end of the first through electrode THV1 and a first end of the second through electrode THV2 may be in a THV region THV_RH of the first semiconductor layer L1, and a second end of the first through electrode THV1 and a second end of the second through electrode THV2 may be in a THV region THV_RL of the second semiconductor layer L2.

The page buffer circuit 210 may detect a defect of the first memory cell MC1 through the first bit line BL1 and the first lower bit line LVBL1. For example, the page buffer circuit 210 may detect a defect of the first bit line BL1 connected to the first memory cell MC1 by performing a pre-sensing operation. The page buffer circuit 210 may detect a defect of the first bit line BL1 and a defect of the word lines WL that are connected to the first memory cell MC1 by performing a post-sensing operation. The page buffer circuit 210 may detect a defect of the second memory cell MC2 through the second bit line BL2 and the second lower bit line LVBL2. For example, the page buffer circuit 210 may detect a defect of the second bit line BL2 connected to the second memory cell MC2 by performing a pre-sensing operation. The page buffer circuit 210 may detect a defect of the second bit line BL2 and a defect of the word lines WL that are connected to the second memory cell MC2 by performing a post-sensing operation.

The page buffer circuit 210 may store the number of off-cells having the defect of the first bit line BL1 during the pre-sensing operation. The page buffer circuit 210 may store the number of off-cells having the defect of the first bit line BL1 and/or the defects of the word lines WL during the post-sensing operation. Also, the page buffer circuit 210 may store the number of off-cells having the defect of the second bit line BL2 during the pre-sensing operation. The page buffer circuit 210 may store the number of off-cells having the defect of the second bit line BL2 and/or the defects of the word lines WL during the post-sensing operation.

The page buffer circuit 210 may be disposed in a direction in which lower bit lines LVBL1 and LVBL2 extend (i.e., the second direction D2). The page buffer circuit 210 may include the page buffers PB1 to PBm. The page buffers PB1 to PBm may be arranged along a line in the second direction D2.

The defect detection circuit 230 may control the page buffer circuit 210 based on a pre-sensing signal and a post-sensing signal. The defect detection circuit 230 may control the page buffer circuit 210 based on a pre-sensing signal and a post-sensing signal. In this regard, the defect detection circuit 230 may adjust timings of a pre-sensing signal and a post-sensing signal. The defect detection circuit 230 may detect a defect of the word line WL based on results of a pre-sensing operation and a post-sensing operation.

For example, the defect detection circuit 230 may compare the number of off-cells in which the defect of the first bit line BL1 is detected as a result of a pre-sensing operation with the number of off-cells in which the defect of the first bit line BL1 and/or the defect of word lines WL is/are detected as a result of a post-sensing operation. The defect detection circuit 230 may compare the number of off-cells in which the defect of the second bit line BL2 is detected as a result of a pre-sensing operation with the number of off-cells in which the defect of the second bit line BL2 and/or the defect of word lines WL is/are detected as a result of a post-sensing operation. Here, the comparison of the numbers of off-cells refers to obtaining a difference between the number of off-cells in the pre-sensing operation and the number of off-cells in the post-sensing operation.

The defect detection circuit 230 may detect a defect of the word line WL when the number of off-cells in the post-sensing operation is equal to or greater than the number of off-cells in the pre-sensing operation. When a defect of the word lines WL is detected, the defect detection circuit 230 may process a memory block (one of BLK0 to BLKi of FIG. 5) as a BB. The defect detection circuit 230 may detect defects of the word lines WL and perform BB processing, thereby preventing unrecoverable data from being generated. Also, data reliability may be improved.

Figure 5:
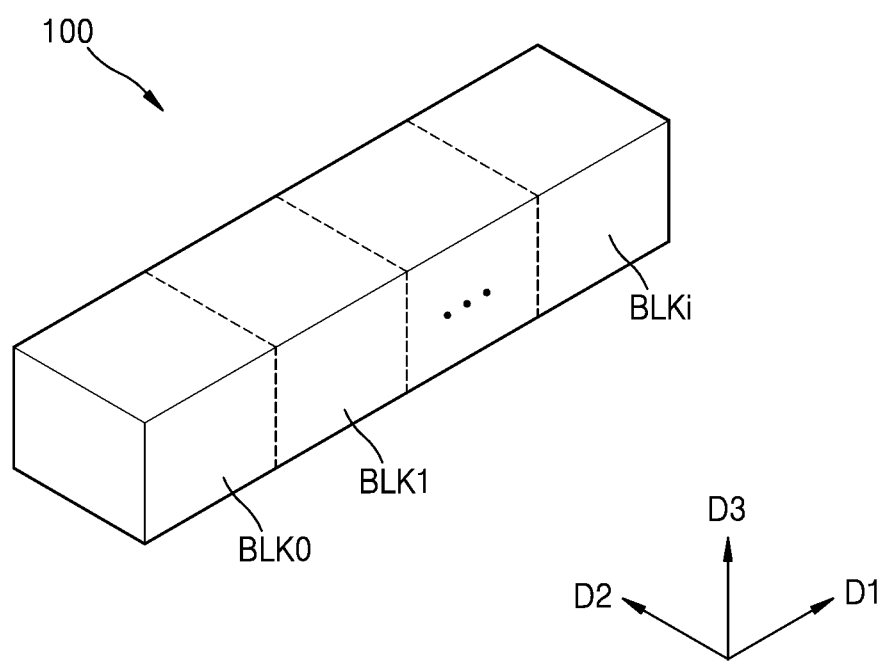
FIG. 5 is a diagram showing an example of a memory cell array according to an example embodiment.

FIG. 5 is a diagram showing an example of the memory cell array 100 of FIG. 1 according to an example embodiment.

Referring to FIG. 5, the memory cell array 100 may include a plurality of memory blocks BLK0 to BLKi, wherein i is be a positive integer. The memory blocks BLK1 to BLKi may each have a three-dimensional structure (or a vertical structure). In detail, the memory blocks BLK0 to BLKi may each include a plurality of NAND strings extending in a vertical direction (i.e., the third direction D3). Here, the NAND strings may be spaced apart from one another a particular distance in the first direction D1 and the second direction D2. The memory blocks BLK0 to BLKi may be selected by a row decoder (260 of FIG. 1). For example, the row decoder 260 may select a memory block corresponding to a block address from among the memory blocks BLK0 to BLKi.

Figure 6:
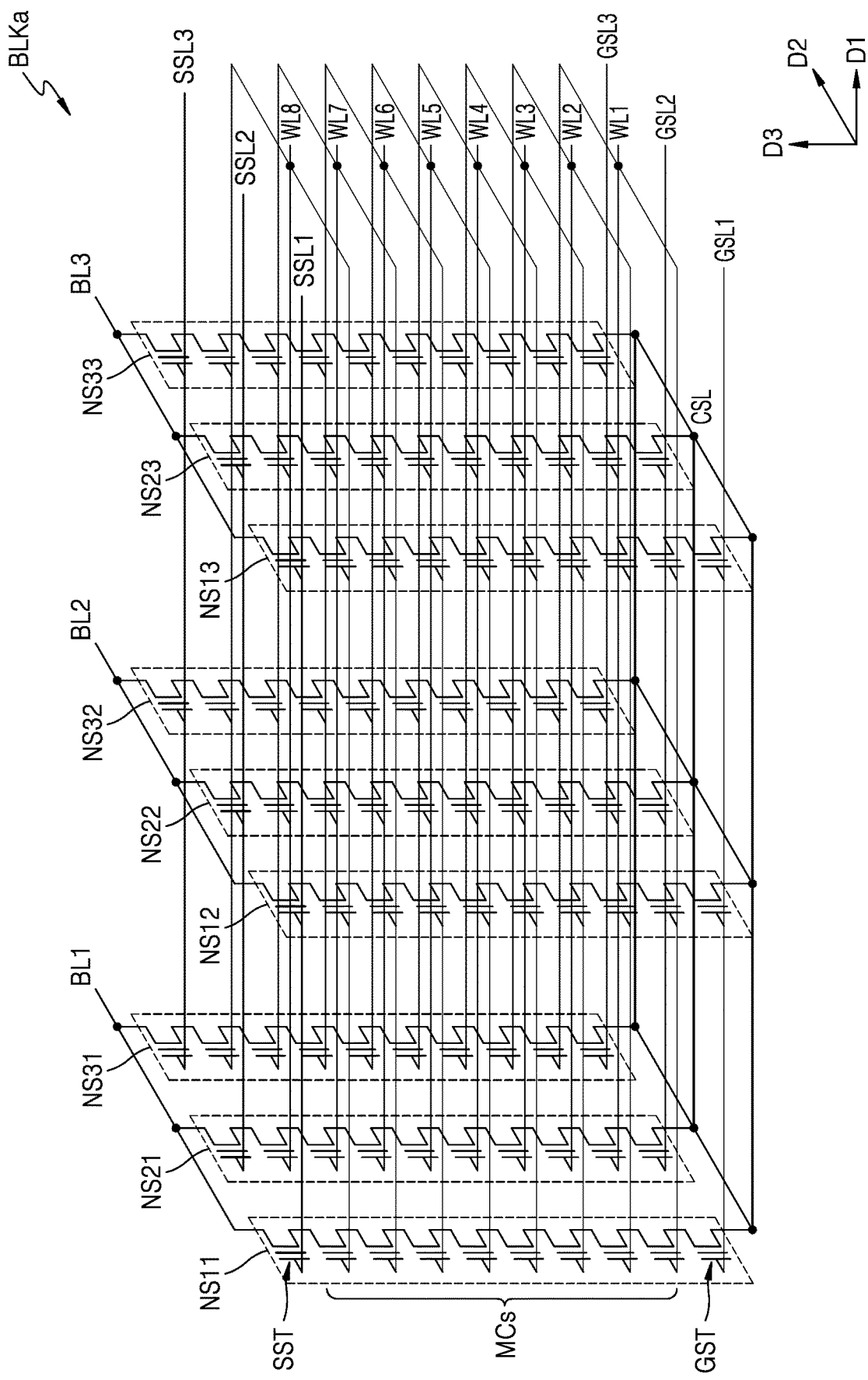
FIG. 6 is a perspective view of a memory block according to an example embodiment.

FIG. 6 is a perspective view of the memory block of FIG. 5 according to an example embodiment.

Referring to FIG. 6, a memory block BLKa may correspond to one of the memory blocks BLK0 to BLKi of FIG. 5. The memory block BLKa may include NAND strings NS11 to NS33, and each NAND string (e.g., NS11) may include a string select transistor SST, a plurality of memory cells MCs, and a ground select transistor GST connected in series. The string select transistor SST, the ground select transistor GST, and the memory cells MCs included in each NAND string may form a stacked structure on a substrate in a vertical direction (the third direction D3).

Word lines WL1 to WL8 may extend in the second direction D2, and bit lines BL1 to BL3 may extend in the first direction D1. NAND cell strings NS11, NS21, and NS31 may be provided between a first bit line BL1 and a common source line CSL, NAND cell strings NS12, NS22, and NS32 may be provided between a second bit line BL2 and the common source line CSL, and NAND cell strings NS13, NS23, and NS33 may be provided between a third bit line BL3 and the common source line CSL. The string select transistor SST may be coupled to corresponding string select lines SSL1 to SSL3. The memory cells MCs may be respectively connected to corresponding word lines WL1 to WL8. The ground select transistor GST may be coupled to corresponding ground select lines GSL1 to GSL3. The string select transistors SST may be respectively connected to a corresponding bit line BL, and the ground select transistor GST may be connected to the common source line CSL. Here, the number of NAND strings, the number of word lines, the number of bit lines, the number of ground select lines, and the number of string select lines may vary depending on example embodiments.

Figure 7:
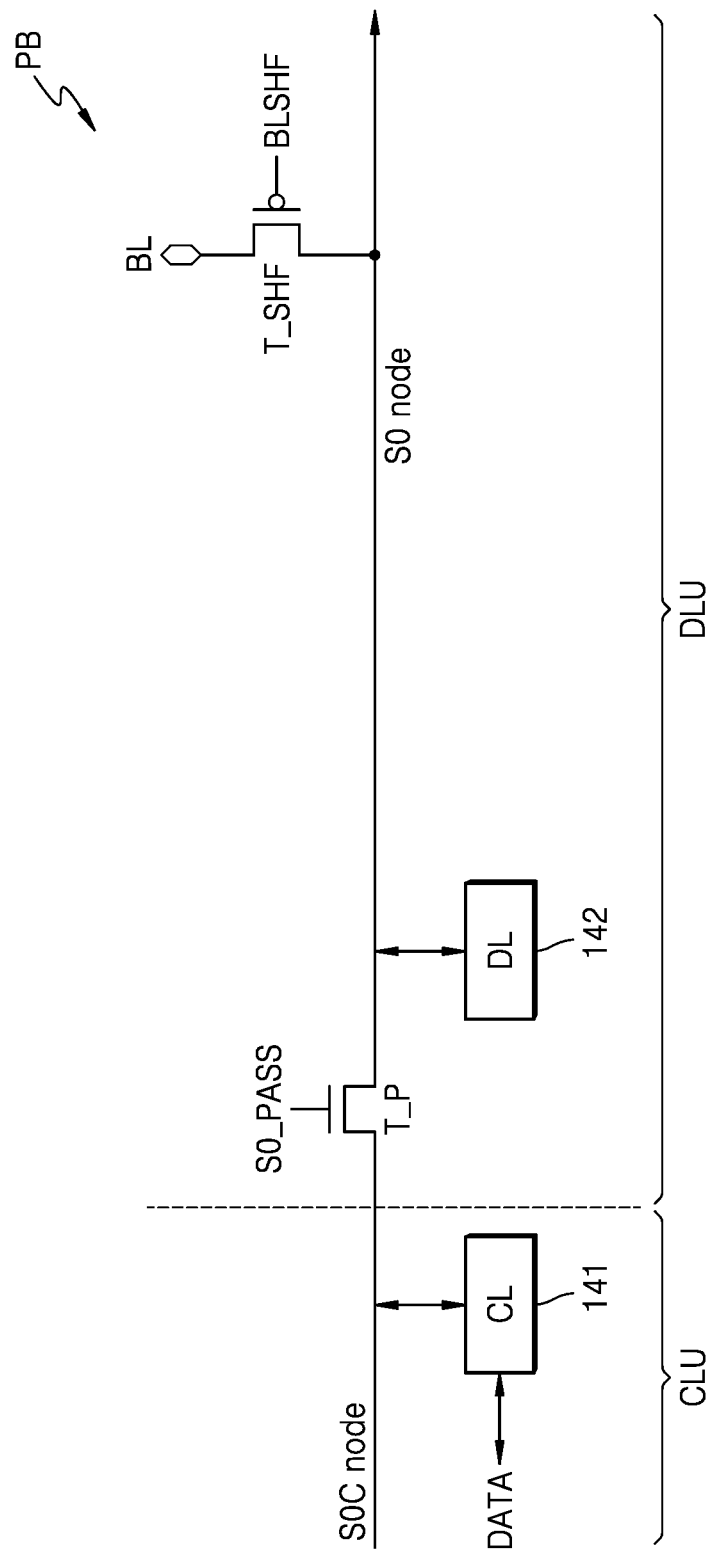
FIG. 7 is a circuit diagram showing an implementation example of a page buffer according to an example embodiment.

FIG. 7 is a circuit diagram showing an implementation example of a page buffer according to an example embodiment.

Referring to FIG. 7, a page buffer PB may include a cache latch circuit CLU and a data latch circuit DLU. The page buffer PB may correspond to one of the page buffers PB1 to PBm of FIG. 1.

The cache latch circuit CLU may include a cache latch CL. For example, the cache latch CL may store data DATA to be written to a memory cell. Also, the cache latch CL may store data DATA transmitted from a data latch DL. The cache latch CL may be connected to a combined sensing node SOC. The cache latch CL may transmit/receive data DATA through the combined sensing node SOC. Although FIG. 7 shows that the cache latch circuit CLU includes one cache latch CL, the cache latch circuit CLU may include two or more cache latches CL. The combined sensing node SOC may be connected to a sensing node SO through a pass transistor T_P.

The pass transistor T_P may be turned on or off according to a pass signal SO_PASS. When the pass transistor T_P is turned on, data DATA may be transmitted between the cache latch CL and the data latch DL. For example, the data latch DL may be connected to the sensing node SO and store data DATA transmitted from the cache latch CL. Also, the data latch DL may store data DATA read from the memory cell and may transmit the data DATA to the cache latch CL. Although one data latch DL is shown in FIG. 7, the data latch circuit DLU may include two or more data latches DL.

The sensing node SO may be pre-charged during a read operation, a write operation, or an erase operation of the memory device 10. For example, the sensing node SO may be connected to the bit line BL through a shut-off transistor T_SHF. The shut-off transistor T_SHF may be turned on or off according to a bit line shut-off signal BLSHF. The shut-off transistor T_SHF may be an N-type transistor. However, the type of the shut-off transistor T_SHF is not limited thereto.

As described above, the page buffer PB may be controlled differently according to a pre-sensing signal and a post-sensing signal generated by the defect detection circuit 230. For example, the page buffer PB may detect only a defect of the bit line BL based on a pre-sensing signal or may detect a defect of the bit line BL and a defect of the word line WL simultaneously based on a post-sensing signal.

Figure 8:
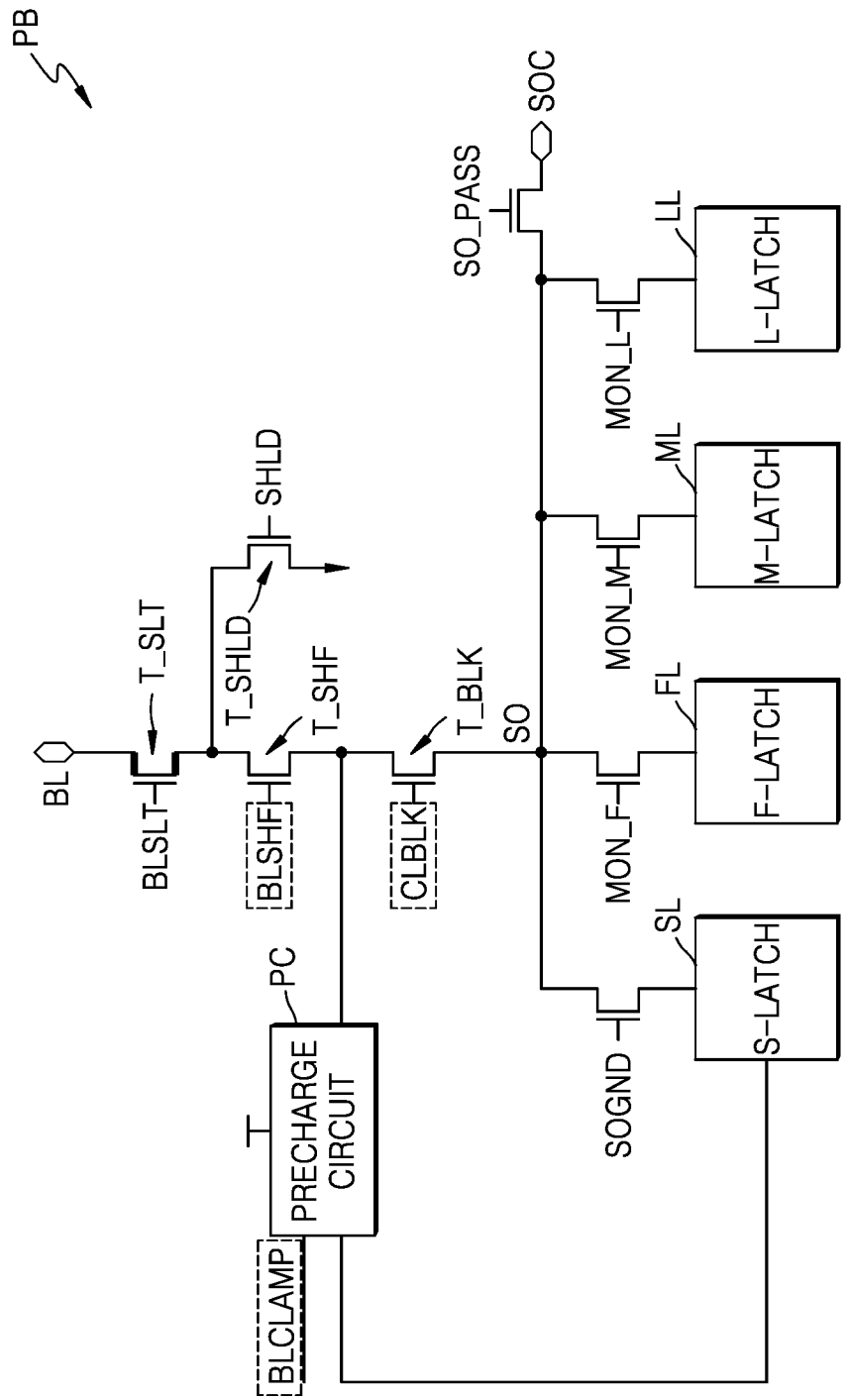
FIG. 8 is a circuit diagram showing a detailed implementation example of a page buffer according to an example embodiment.

FIG. 8 is a circuit diagram showing a detailed implementation example of a page buffer according to an example embodiment.

FIG. 8 shows a data latch circuit of a page buffer PB and, for example, the page buffer PB may include a bit line select transistor T_SLT connected to the bit line BL and driven by a bit line select signal BLSLT. The bit line select transistor T_SLT may include a high-voltage transistor.

In addition, the page buffer PB may further include one or more latches, that is, a sensing latch SL, a force latch FL, a more-significant-bit latch ML, and a less-significant-bit latch LL that are connected to the sensing node SO and may further include transistors arranged between the sensing node SO and the one or more latches and operating according to various control signals SOGND, MON_F, MON_M, and MON_L.

Also, the page buffer PB may further include a pre-charge circuit PC capable of controlling a pre-charge operation performed on the bit line BL or the sensing node SO based on a bit line clamping control signal BLCLAMP. Latches may store various pieces of information. For example, the sensing latch SL may store data stored in a memory cell or a result of sensing a threshold voltage of the memory cell during a read operation or a program verify operation. Also, the force latch FL may be utilized to improve threshold voltage distribution during a program operation. Also, the more-significant-bit latch ML, the less-significant-bit latch LL, and a cache latch may be used to store data input from the outside during a program operation.

In addition, the page buffer PB may further include one or more other transistors. According to an example embodiment, the page buffer PB may further include the bit line shut-off transistor T_SHF and a bit line connection control transistor T_BLK connected in series between the bit line select transistor T_SLT and the sensing node SO. Also, the page buffer PB may further include a bit line shield transistor T_SHLD connected to the bit line select transistor T_SLT and the bit line shut-off transistor T_SHF.

Also, according to an example embodiment, the page buffer PB may further include a transistor that controls connection to the combined sensing node SOC according to the pass control signal SO_PASS.

The page buffer PB shown in FIG. 8 may detect a defect of a word line by controlling one or more transistors provided therein according to example embodiments.

Figure 9:
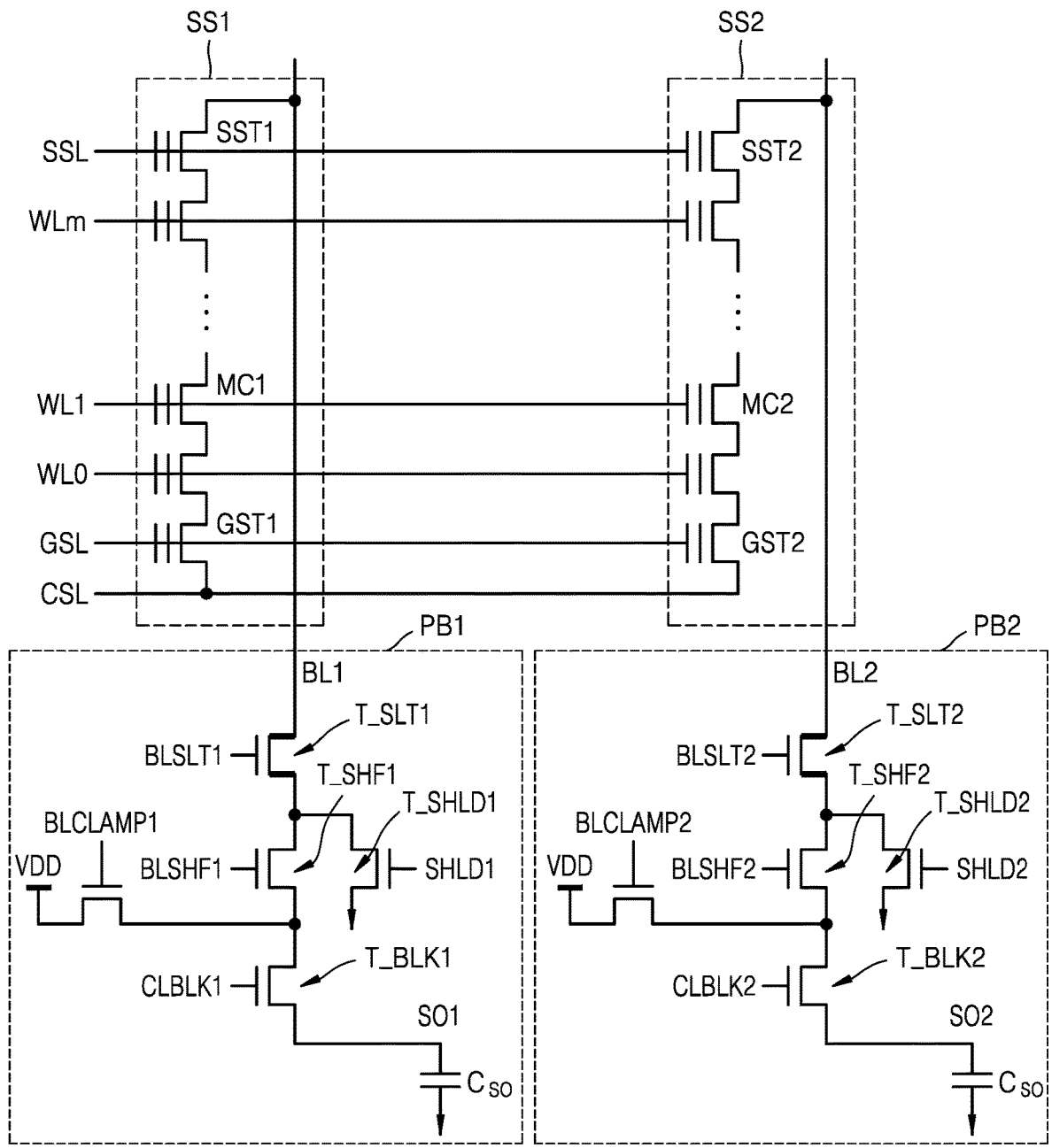
FIG. 9 is a circuit diagram showing page buffers according to an example embodiment.

FIG. 9 is a circuit diagram showing page buffers according to an example embodiment.

Referring to FIG. 9, a first page buffer PB1 may be connected to a first NAND string SS1 through the first bit line BL1, and a second page buffer PB2 may be connected to a second NAND string SS2 through the second bit line BL2. For convenience of explanation, FIG. 9 shows that the first page buffer PB1 is directly connected to the first bit line BL1 and the second page buffer PB2 is directly connected to the second bit line BL2. However, example embodiments are not limited thereto.

The first NAND string SS1 and the second NAND string SS2 may respectively include ground select transistors GST1 and GST2, memory cells including the first memory cell MC1 and the second memory cell MC2, and string select transistors SST1 and SST2. The ground select transistors GST1 and GST2 may be connected to the common source line CSL and the ground select lines GSL, and the memory cells may be respectively connected to the word lines WL0 to WLm. The string select transistors SST1 and SST2 may be commonly connected to the string select line SSL and respectively connected to the first bit line BL1 and the second bit line BL2. Therefore, the first memory cell MC1 may be connected to the first page buffer PB1 through the first bit line BL1, and the second memory cell MC2 may be connected to the second page buffer PB2 through the second bit line BL2.

The first page buffer PB1 may include a first bit line BL1 select transistor T_SLT1 driven by a first bit line selection signal BLSLT1, a first bit line shut-off transistor T_SHF1 driven by a first bit line shut-off signal BLSHF1, a first bit line connection control transistor T_BLK1 driven by a first bit line connection control signal CLBLK1, and a first bit line shield transistor T_SHLD1 driven by a first bit line shield signal SHLD1. For example, the first bit line select transistor T_SLT1 may be turned on according to a first bit line select signal BLSLT1 having a high level, and the first bit line select transistor T_SLT1 may be turned off according to a first bit line select signal BLSLT1 having a low level. For example, the first bit line shut-off transistor T_SHF may be turned on according to a first bit line shut-off signal BLSHF1 having a high level, and the first bit line shut-off transistor T_SHF may be turned off according to a first bit line shut-off signal BLSHF1 having a low level. For example, the first bit line connection control transistor T_BLK1 may be turned on according to a first bit line connection control signal CLBLK1 having a high level, and the first bit line connection control transistor T_BLK1 may be turned off according to a first bit line connection control signal CLBLK1 having a low level. For example, a first bit line shield transistor T_SHLD1 may be turned on according to a first bit line shield signal SHLD1 having a high level, and the first bit line shield transistor T_SHLD1 may be turned off according to a first bit line shield signal SHLD1 having a low level.

The first bit line select transistor T_SLT1, the first bit line shut-off transistor T_SHF1, and the first bit line connection control transistor T_BLK1 may be arranged between the first bit line BL1 and a first sensing node S01.

Similarly, the second page buffer PB2 may include a second bit line BL2 select transistor T_SLT2 driven by a second bit line selection signal BLSLT2, a second bit line shut-off transistor T_SHF1 driven by a second bit line shut-off signal BLSHF2, a second bit line connection control transistor T_BLK2 driven by a second bit line connection control signal CLBLK2, and a second bit line shield transistor T_SHLD2 driven by a second bit line shield signal SHLD2.

As described above, the page buffers PB1 to PBm may each detect a defect of a bit line and a defect of a word line of a memory block through a setup operation, a bit line develop operation, a sensing node develop operation, and a sensing operation based on transistors. Transistors of each of the page buffers (PB1 to PBm) may be driven by a pre-sensing signal and/or a post-sensing signal. The defect detection circuit 230 described above may control each of the page buffers PB1 to PBm by using a generated pre-sensing signal and a generated post-sensing signal.

Figure 10:
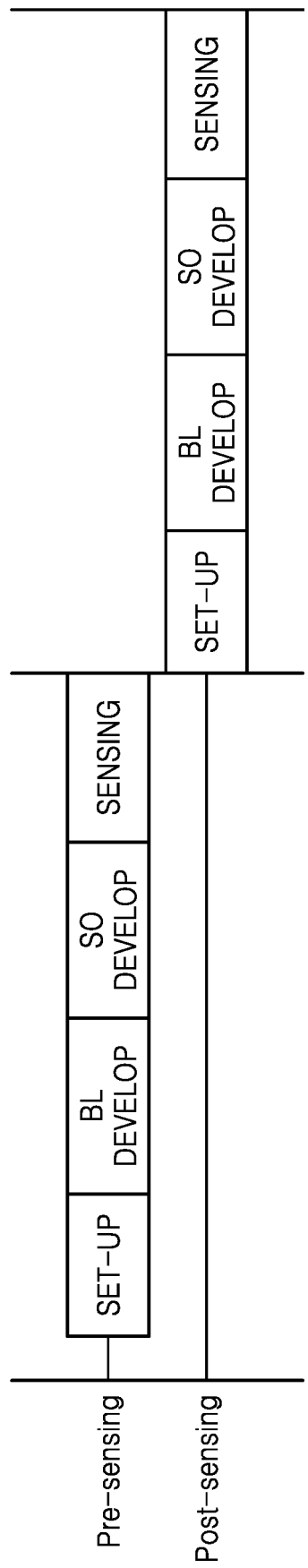
FIG. 10 is a diagram showing defect detection operations according to example embodiments.

FIG. 10 is a diagram showing defect detection operations according to example embodiments.

Referring to FIG. 10, examples of performing pre-sensing and post-sensing based on different control timings are shown. In this case, only a defect of a bit line may be detected by performing a pre-sensing operation, and defects of a bit line and a word line may be detected by performing a post-sensing operation.

Referring to FIG. 10, during a pre-sensing operation and a post-sensing operation, a defect of a bit line and a word line may be detected through a setup operation, a bit line develop operation, a sensing node develop operation, and a sensing operation.

Referring to FIG. 10, a setup operation SET-UP of a pre-sensing operation PRE may be started before a setup operation of a post-sensing operation. A bit line develop operation BLDEVELP of the pre-sensing operation may be started before a bit line develop operation of the post-sensing operation. A sensing node develop operation SO DEVELOP of the pre-sensing operation may be started before a sensing node develop operation of the post-sensing operation. A sensing operation SENSING of the pre-sensing operation may be started before a sensing operation of the post-sensing operation. The sensing operation of the pre-sensing operation may be started before the setup operation of the post-sensing operation. The sensing operation of the pre-sensing operation may be completed before the setup operation of the post-sensing operation is started. In this regard, after the sensing operation of the pre-sensing operation ends, the setup operation of the post-sensing operation may be started.

As described above, because the timings of the pre-sensing operation and the post-sensing operation according to example embodiments are controlled differently, a time point at which a defect of a bit line is detected and a time point at which a defect of a word line is detected are different from each other, and thus, only the defect of the word line may be easily detected. Also, by detecting a defect of the word line WL and performing BB processing, generation of unrecoverable data may be prevented, and thus, data reliability may be improved.

Figure 11:
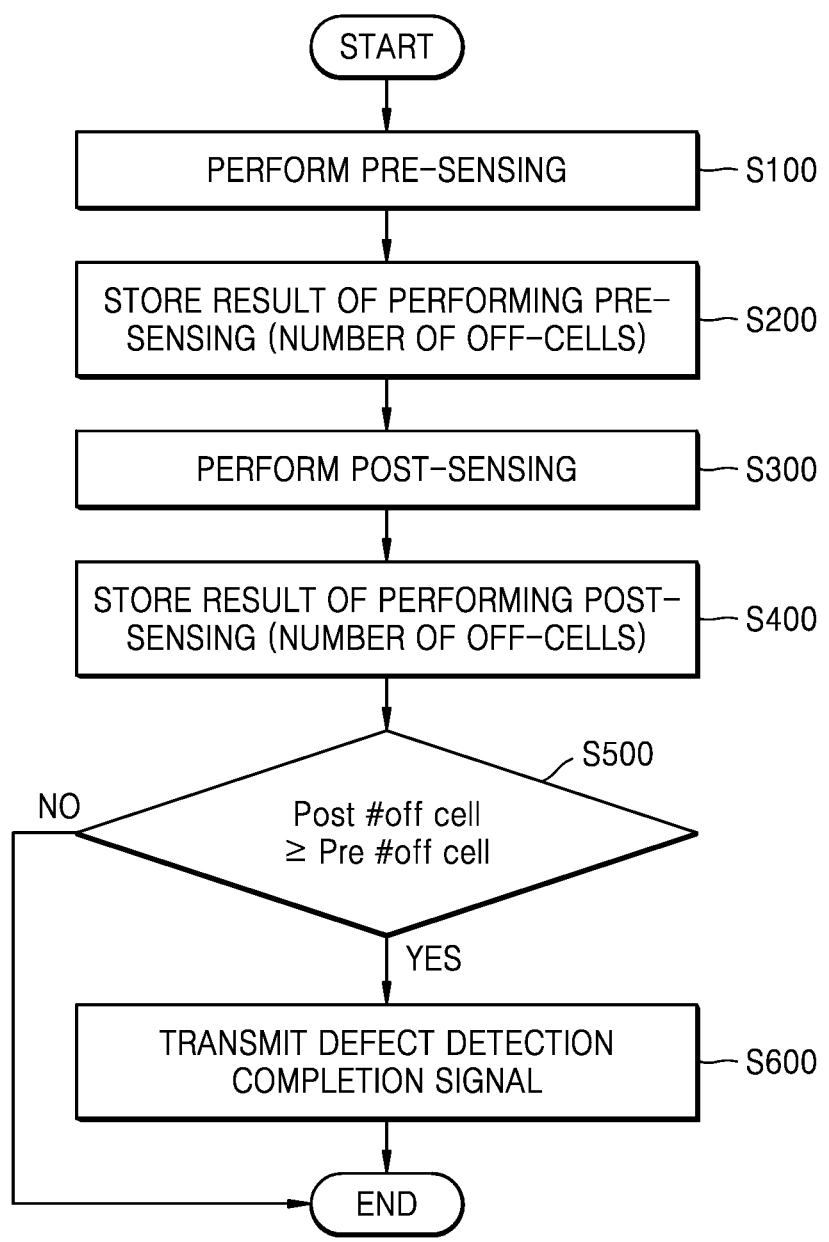
FIG. 11 is a flowchart showing a defect detection operation according to an example embodiment.

FIG. 11 is a flowchart showing a defect detection operation according to an example embodiment.

Referring to FIG. 11, the defect detection circuit may generate a pre-sensing signal and transmit the generated pre-sensing signal to a page buffer, and thus, the page buffer may perform a pre-sensing operation (operation S100). As described above, a pre-sensing operation may include a setup operation, a bit line develop operation, a sensing node develop operation, and a sensing operation.

When a pre-sensing operation is performed, a defect of a bit line may be detected, and the number of off-cells in which bit line defects are detected may be stored in the page buffer (operation S200). The number of off-cells with bit line defects may be stored in the sensing latch SL shown in FIG. 8.

The defect detection circuit may generate a post-sensing signal and transmit the generated post-sensing signal to the page buffer, and thus, the page buffer may perform a post-sensing operation (operation S300). As described above, a post-sensing operation may include a setup operation, a bit line develop operation, a sensing node develop operation, and a sensing operation.

When a post-sensing operation is performed, a defect of a bit line and a defect of a word line may be detected, and the number of off-cells in which bit line defects and word line defects are detected may be stored in the page buffer (operation S400). The number of off-cells with bit line defects and word line defects may be stored in the sensing latch SL shown in FIG. 8.

The number of off-cells in the pre-sensing operation and the number of off-cells in the post-sensing operation may be counted. The number of off-cells in the pre-sensing operation and the number of off-cells in the post-sensing operation may be counted by the first counter circuit 231 and the second counter circuit 232 of FIG. 2, respectively. For example, the first counter circuit 231 may count the number of off-cells in the pre-sensing operation, and the second counter circuit 232 may count the number of off-cells in the post-sensing operation. However, example embodiments are not limited thereto. For example, the first counter circuit 231 may count the number of off-cells in the post-sensing operation, and the second counter circuit 232 may count the number of off-cells in the pre-sensing operation. A counted number of off-cells in the pre-sensing operation may be the first value N1, and a counted number of off-cells in the post-sensing operation may be the second value N2.

The counted number of off-cells in the pre-sensing operation may be compared with the counted number of off-cells in the post-sensing operation. The comparison between the counted number of off-cells in the pre-sensing operation and the counted number of off-cells in the post-sensing operation may be performed by the comparison circuit 233 of FIG. 2.

In operation S500, it may be determined whether the second value N2 is greater than the first value N1. When the second value N2 is greater than the first value N1, the control logic circuit 220 of FIG. 1 may generate a defect detection completion signal (operation S600). The defect detection completion signal may (instruct to) perform BB processing on a corresponding memory block.

Hereinafter, signals for performing a pre-sensing operation and a post-sensing operation for controlling a page buffer are described in detail with reference to FIGS. 12 to 14. In detail, an example of performing a pre-sensing operation is described with reference to FIGS. 12 and 13, and an example of performing a post-sensing operation is described with reference to FIGS. 14 and 15.

Figure 12:
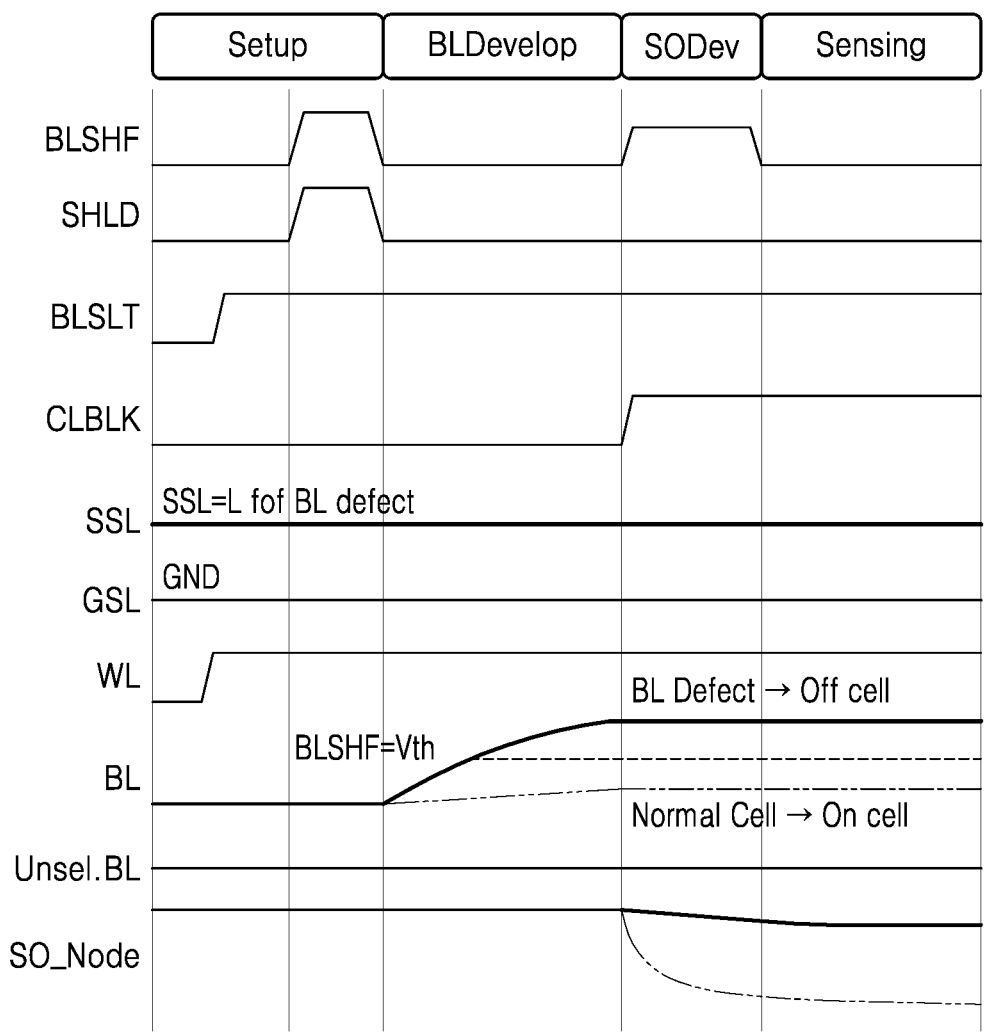
FIG. 12 is a timing diagram showing control signals for performing a pre-sensing operation according to an example embodiment.

FIG. 12 is a timing diagram showing control signals for performing a pre-sensing operation according to an example embodiment.

Referring to FIG. 12, in a setup period, the bit line select signal BLSLT may be controlled to be at a high level. Then, each of the bit line shut-off signal BLSHF and a bit line shield signal SHLD may be controlled to be at a high level. Therefore, the page buffer may be initialized in the setup period.

The bit line shut-off signal BLSHF and a bit line shield signal SHLD may each be controlled to be at a low level in a bit line develop period. Therefore, the voltage of a bit line may be increased to a voltage level corresponding to a level obtained by subtracting a threshold voltage level from a bit line shut-off voltage level.

In a sensing node develop period, the bit line shut-off signal BLSHF may be controlled to be at a high level. The bit line connection control signal CLBLK may also be controlled to be at a high level. In this case, the voltage of the bit line may maintain at the same voltage level as in the bit line develop period. The voltage of a sensing node may decrease.

In a sensing period, a defect of the bit line may be detected. Because the bit line and a string select line are not electrically connected to each other, the voltage level of the string select line may be 0 V, the voltage of the bit line may be a value obtained by subtracting the threshold voltage level from the bit line shut-off voltage level, and the voltage of the sensing node may be a value that converges to 0 V. In the sensing period, a bit line that is defective may have a high voltage level and a bit line that is not defective may have a low voltage level that is close to 0 V. The number of off-cells in which bit line defects are detected may be stored in a sensing latch.

Figure 13:
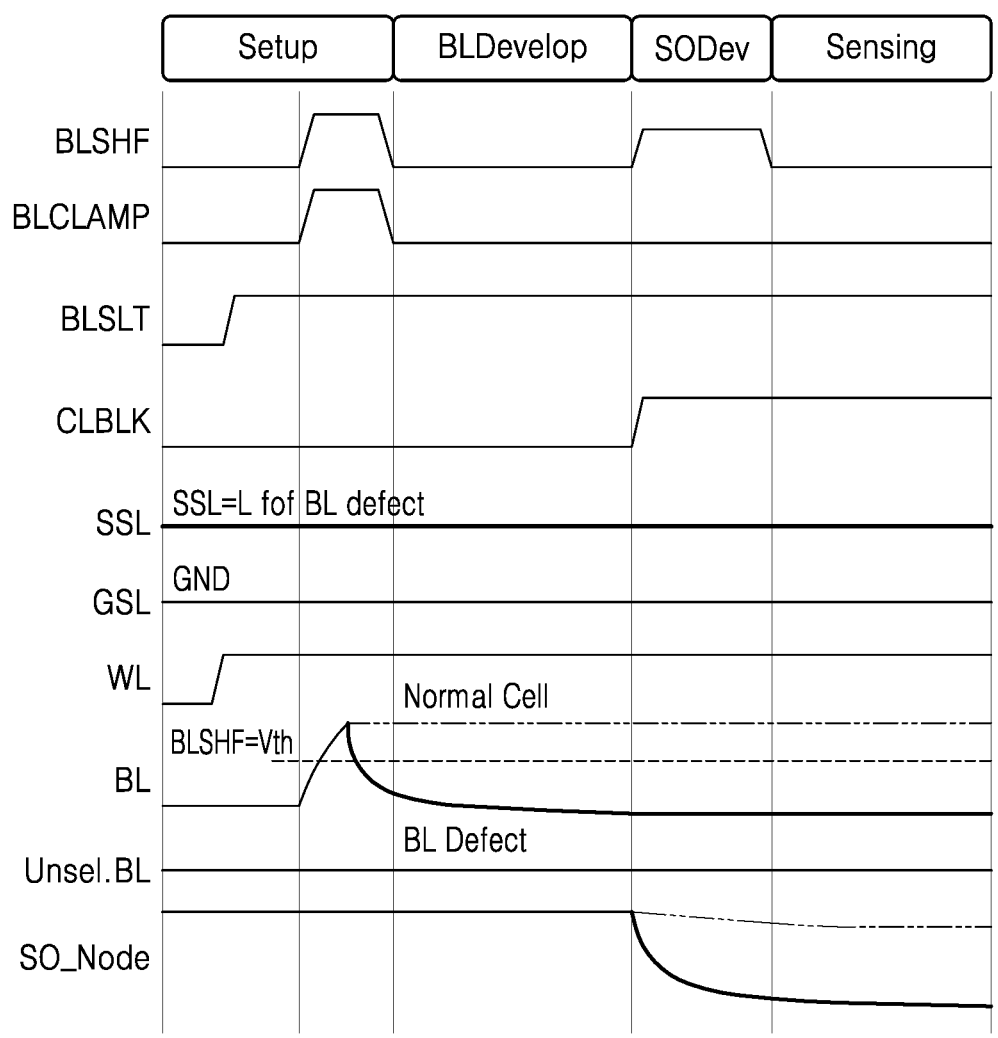
FIG. 13 is a timing diagram showing control signals for performing a pre-sensing operation according to an example embodiment.

FIG. 13 is a timing diagram showing control signals for performing a pre-sensing operation according to an example embodiment. Descriptions identical to those given above with reference to FIG. 12 are omitted below.

Referring to FIG. 13, a description is given under an assumption that the voltage level of the bit line corresponds to a ground voltage GND. With reference to FIG. 12, descriptions have been given under an assumption that the voltage level of the bit line corresponds to a power voltage VDD.

Referring to FIG. 13, in a setup period, the bit line select signal BLSLT may be controlled to be at a high level. Then, each of the bit line shut-off signal BLSHF and a bit line clamp signal BLCLAMP may be controlled to be at a high level. Therefore, the voltage of the bit line may be increased to a voltage level corresponding to a level obtained by subtracting a threshold voltage level from a bit line shut-off voltage level.

In the bit line develop period, the bit line shut-off signal BLSHF and a bit line clamp signal BLCLAMP may each be controlled to be at a low level. In this case, the voltage of a bit line may be decreased from a voltage level corresponding to a level obtained by subtracting a threshold voltage level from a bit line shut-off voltage level to the ground voltage GND.

In a sensing node develop period, the bit line shut-off signal BLSHF may be controlled to be at a high level. The bit line connection control signal CLBLK may also be controlled to be at a high level. In this case, the voltage of the bit line may be maintained at the same voltage level as in the bit line develop period. The voltage of a sensing node may decrease.

In a sensing period, a defect of the bit line may be detected. Because the bit line and a string select line are not electrically connected, the voltage level of the string select line may be 0 V, and the voltage of the bit line and the voltage of the sensing node may be values that converge to 0 V. In the sensing period, a bit line that is defective may have a low voltage level that is close to 0 V and a bit line that is not defective may have a high voltage level. The number of cells in which bit line defects are detected may be stored in a sensing latch.

Figure 14:
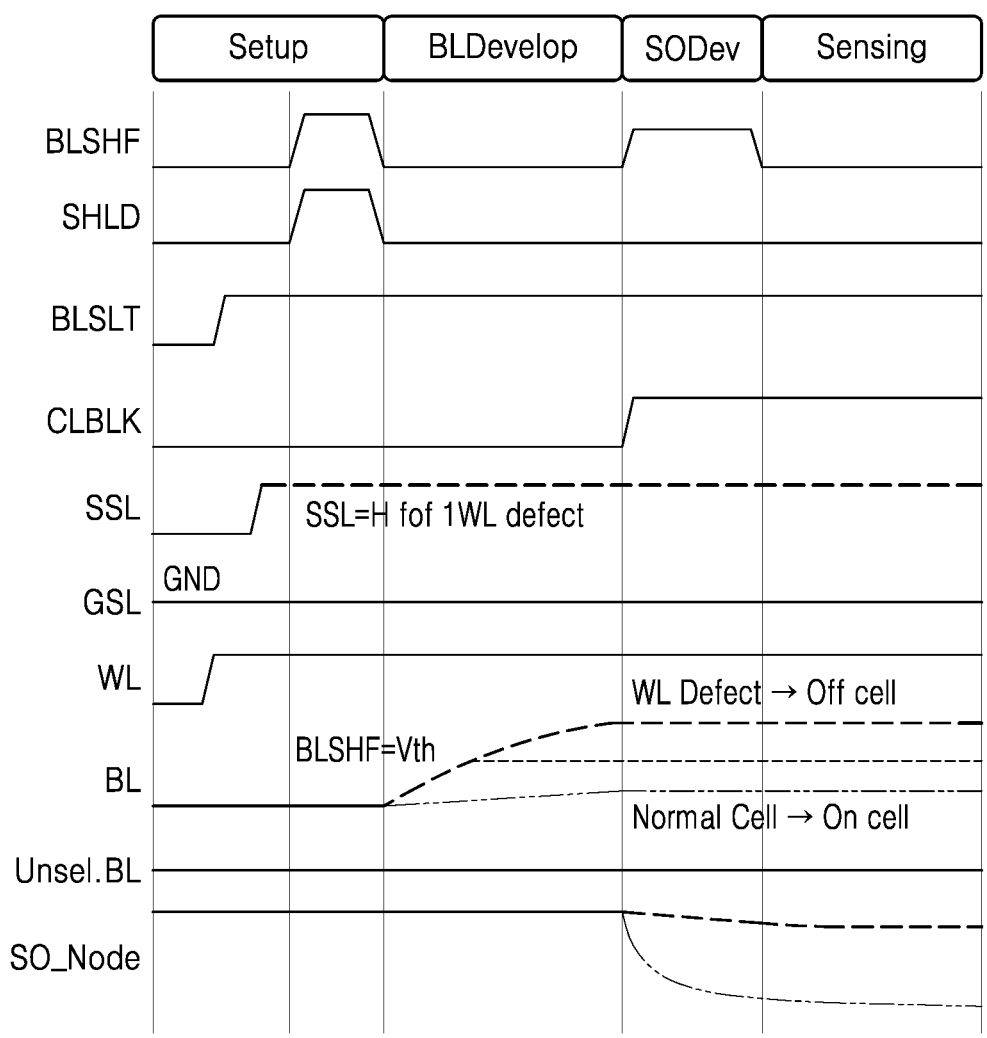
FIG. 14 is a timing diagram showing control signals for performing a post-sensing operation according to an example embodiment.

FIG. 14 is a timing diagram showing control signals for performing a post-sensing operation according to an example embodiment.

Referring to FIG. 14, in a setup period, the bit line select signal BLSLT may be controlled to be at a high level. Then, each of the bit line shut-off signal BLSHF and the bit line shield signal SHLD may be controlled to be at a high level. Therefore, the page buffer may be initialized in the setup period. Also, the voltage of a string select line connected to a bit line may increase.

The bit line shut-off signal BLSHF and a bit line shield signal SHLD may each be controlled to be at a low level in a bit line develop period. Therefore, the voltage of a bit line may be increased to a voltage level corresponding to a level obtained by subtracting a threshold voltage level from a bit line shut-off voltage level.

In a sensing node develop period, the bit line shut-off signal BLSHF may be controlled to be at a high level. The bit line connection control signal CLBLK may also be controlled to be at a high level. In this case, the voltage of the bit line may maintain the same voltage level as in the bit line develop period. The voltage of a sensing node may decrease.

In a sensing period, defects of the bit line and a word line may be detected. Because the bit line and a string select line are electrically connected, the voltage level of the string select line may be a high level, the voltage of the bit line may be a value obtained by subtracting the threshold voltage level from the bit line shut-off voltage level, the voltage of the word line may also be a high level, and the voltage of the sensing node may be a value that converges to 0 V. In the sensing period, a bit line having a high voltage level is indicative of a defect, and a bit line having a low voltage level that is close to 0 V is indicative of no defect. The number of off-cells in which bit line defects and word line defects are detected may be stored in a sensing latch.

Figure 15:
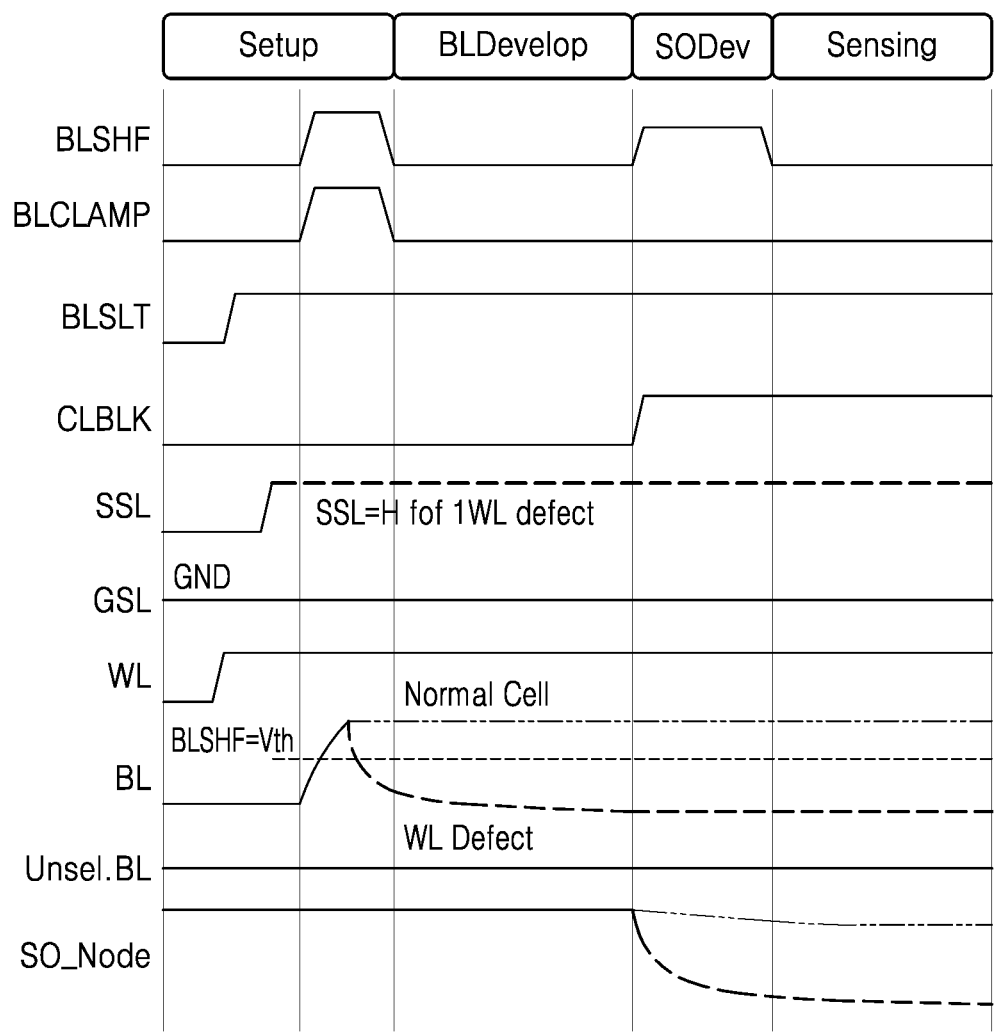
FIG. 15 is a timing diagram showing control signals for performing a post-sensing operation according to an example embodiment.

FIG. 15 is a timing diagram showing control signals for performing a post-sensing operation according to an example embodiment. Descriptions identical to those given above with reference to FIG. 14 are omitted below.

Referring to FIG. 15, a description is given under an assumption that the voltage level of the bit line corresponds to the ground voltage GND. With reference to FIG. 14, descriptions have been given under an assumption that the voltage level of the bit line corresponds to the power voltage VDD.

Referring to FIG. 15, in a setup period, the bit line select signal BLSLT may be controlled to be at a high level. Then, each of the bit line shut-off signal BLSHF and a bit line clamp signal BLCLAMP may be controlled to be at a high level. Therefore, the voltage of the bit line may be increased to a voltage level corresponding to a level obtained by subtracting a threshold voltage level from a bit line shut-off voltage level. Also, the voltage of a string select line connected to a bit line may increase.

In the bit line develop period, the bit line shut-off signal BLSHF and the bit line clamp signal BLCLAMP may each be controlled to be at a low level. In this case, the voltage of a bit line may be decreased from a voltage level corresponding to a level obtained by subtracting a threshold voltage level from a bit line shut-off voltage level to the ground voltage GND.

In a sensing node develop period, the bit line shut-off signal BLSHF may be controlled to be at a high level. The bit line connection control signal CLBLK may also be controlled to be at a high level. In this case, the voltage of the bit line may maintain the same voltage level as in the bit line develop period. The voltage of a sensing node may decrease.

In a sensing period, defects of the bit line and a word line may be detected. Because the bit line and a string select line are electrically connected, the voltage level of the string select line may be a high level, and the voltage level of the bit line and the voltage level of the sensing node may each be a low level. In the sensing period, a bit line having a low voltage level that is close to 0 V may be indicate of a bit line and word line defect, and a bit line having a high voltage level may be indicative of no defect being in the bit line or the word line. The number of cells in which bit line defects and word line defects are detected may be stored in a sensing latch.

Figure 16:
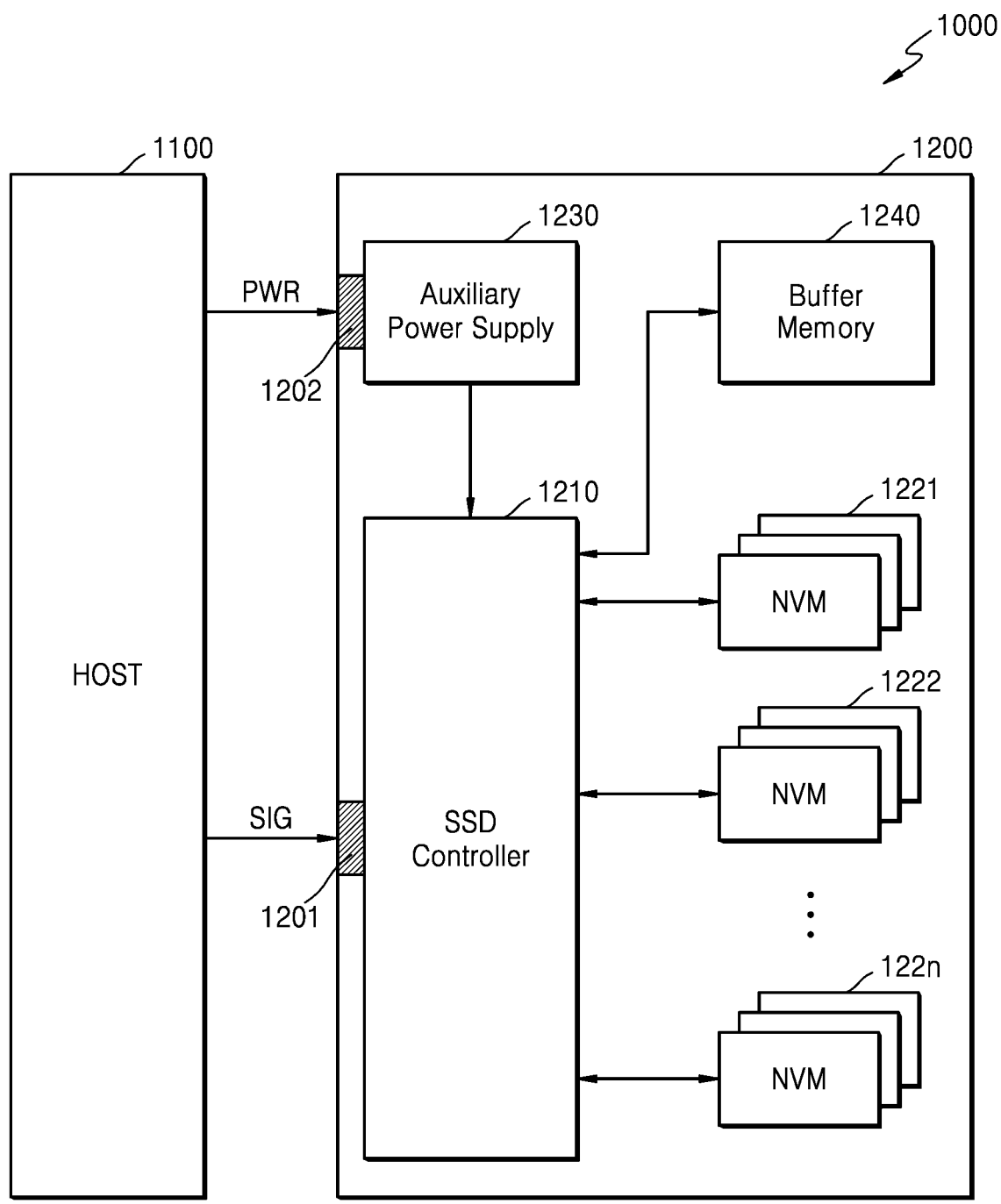
FIG. 16 is a block diagram showing an example in which a memory device according to example embodiments is applied to a solid state drive (SSD) system.

FIG. 16 is a block diagram showing an example in which a memory device according to example embodiments is applied to an SSD system.

Referring to FIG. 16, an SSD system 1000 includes a host 1100 and an SSD 1200.

The SSD 1200 may transmit and receive a signal SIG to and from the host 1100 through a signal connector 1201 and may receive power PWR through a power connector 1202. The SSD 1200 may include an SSD controller 1210, a plurality of flash memories 1221 to 122*n*, an auxiliary power supply 1230, and a buffer memory 1240. The flash memories 1221 to 122*n* may be connected to the SSD controller 1210 through a plurality of channels, respectively.

The SSD controller 1210 may control the flash memories 1221 to 122*n* according to a signal SIG received from the host 1100. The SSD controller 1210 may store an internally generated or a signal received from the outside (e.g., the signal SIG received from the host 1100) in the buffer memory 1240. The SSD controller 1210 may correspond to a memory controller.

The flash memories 1221 to 122*m* may operate under control by the SSD controller 1210. The auxiliary power supply 1230 is connected to the host 1100 through the power connector 1202. The flash memories 1221 to 122*m* may each correspond to the memory device 10 described above with reference to FIGS. 1 to 15. For example, the flash memories 1221 to 122*m* may be controlled based on different control timings, respectively.

The auxiliary power supply 1230 may be connected to the host 1100 through the power connector 1202. The auxiliary power supply 1230 may receive the power PWR from the host 1100 by using the power PWR. The auxiliary power supply 1230 may provide power to the SSD 1200 when power supply from the host 1100 is not smooth.

Figure 17:
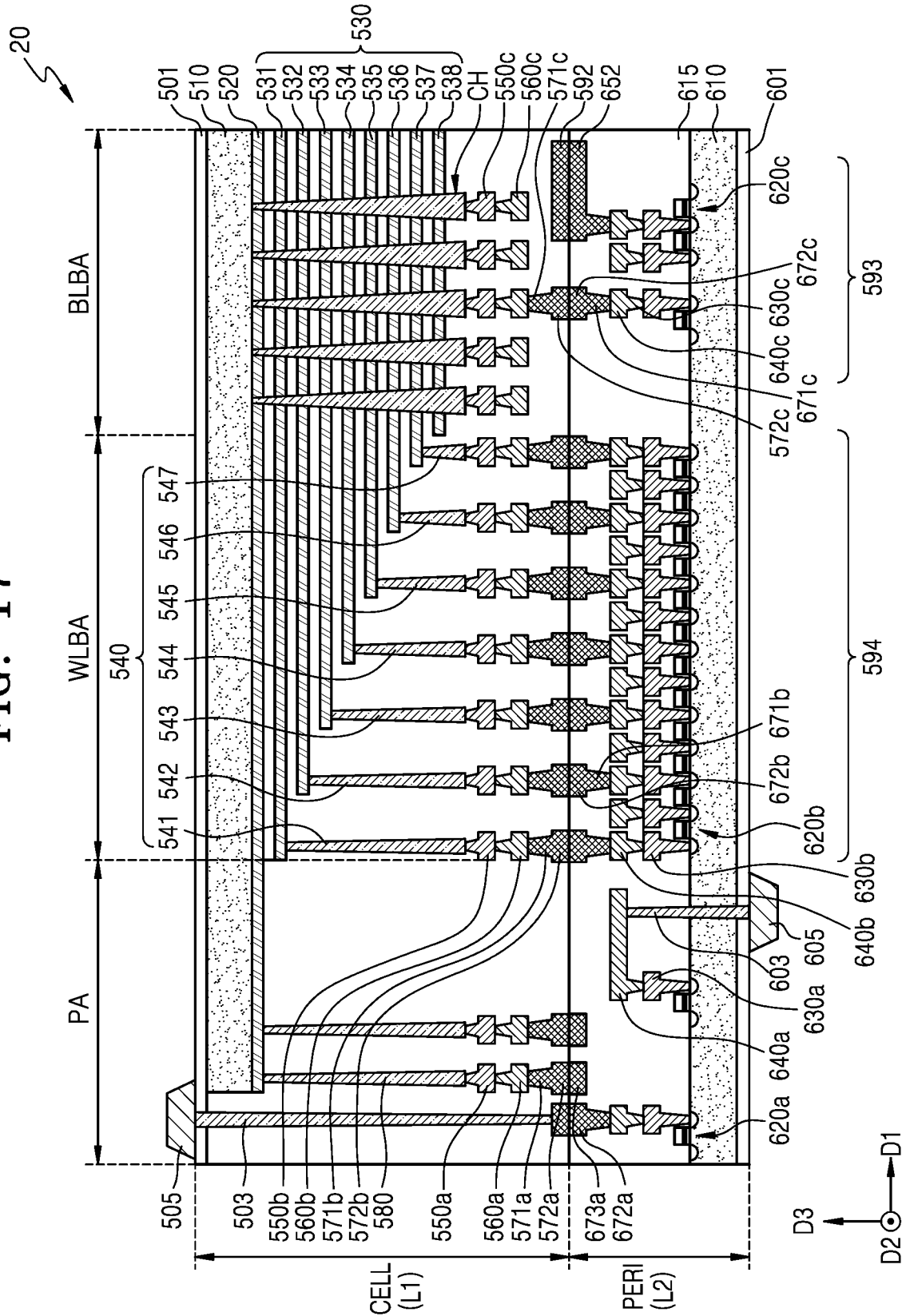
FIG. 17 is a cross-sectional view of a memory device according to an example embodiment.

FIG. 17 is a cross-sectional view of a memory device according to an example embodiment.

Referring to FIG. 17, a memory device 20 may have a chip-to-chip (C2C) structure. Referring to FIG. 17, a cell region CELL of a memory device 20 may correspond to a first semiconductor layer L1, and a peripheral circuit region PERI may correspond to a second semiconductor layer L2. The peripheral circuit region PERI and the cell region CELL of the memory device 20 may each include an external pad bonding area PA, a word line bonding area WLBA, and a bit line bonding area BLBA.

The peripheral circuit region PERI may include a first substrate 610, an interlayer insulation layer 615, a plurality of circuit elements 620*a*, 620*b*, and 620*c* formed on the first substrate 610, first metal layers 630*a*, 630*b*, and 630*c* respectively connected to the circuit elements 620*a*, 620*b*, and 620*c*, and second metal layers 640*a*, 640*b*, and 640*c* respectively formed on the first metal layers 630*a*, 630*b*, and 630*c*. In an example embodiment, the first metal layers 630*a*, 630*b*, and 630*c* may include tungsten having relatively high resistance, whereas the second metal layers 640*a*, 640*b*, and 640*c* may include copper having relatively low resistance.

Although only the first metal layers 630*a*, 630*b*, and 630*c* and the second metal layers 640*a*, 640*b*, and 640*c* are shown, example embodiments are not limited thereto, and one or more metal layers may be further formed on the second metal layers 640*a*, 640*b*, and 640*c*. At least some of the one or more metal layers formed on the second metal layers 640*a*, 640*b*, and 640*c* may include a material, such as aluminum having a lower resistance than copper constituting the second metal layers 640*a*, 640*b*, and 640*c*.

An interlayer insulation layer 615 is provided on the first substrate 610 to cover the circuit elements 620*a*, 620*b*, and 620*c*, the first metal layers 630*a*, 630*b*, and 630*c*, and the second metal layers 640*a*, 640*b*, and 640*c* and may include an insulation materials, such as a silicon oxide or a silicon nitride.

Lower bonding metals 671*b* and 672*b* may be formed on the second metal layer 640*b* in the word line bonding area WLBA. In the word line bonding area WLBA, the lower bonding metals 671*b* and 672*b* in the peripheral circuit region PERI may be electrically connected to upper bonding metals 571*b* and 572*b* in the cell region CELL through bonding, wherein the lower bonding metals 671*b* and 672*b* and the upper bonding metals 571*b* and 572*b* may include aluminum, copper, or tungsten.

The cell region CELL may provide at least one memory block. The cell region CELL may include a second substrate 510 and a common source line 520. On the second substrate 510, a plurality of word lines 531 to 538 and 530 may be stacked in a direction perpendicular to the top surface of the second substrate 510 (i.e., the third direction D3). String select lines and a ground select line may be arranged on the top and bottom of the word lines 530, and the word lines 530 may be arranged between the string select lines and the ground select line.

In the bit line bonding area BLBA, a channel structure CH may extend in a direction perpendicular to the top surface of the second substrate 510 and penetrate through the word lines 530, the string select lines, and the ground select line. The channel structure CH may include a data storage layer, a channel layer, and a buried insulation layer, and the channel layer may be electrically connected to a first metal layer 550*c* and a second metal layer 560*c*. For example, the first metal layer 550c may be a bit line contact, and the second metal layer 560c may be a bit line. According to an example embodiment, the second metal layer 560c may extend in a second direction D2 parallel to the top surface of the second substrate 510.

According to an example embodiment, a region in which the channel structure CH and the bit line 560c are arranged may be defined as the bit line bonding area BLBA. The bit line 560c may be electrically connected to circuit elements 620c, which provide a page buffer 593 in the peripheral circuit region PERI, in the bit line bonding area BLBA. For example, the bit line 560c is connected to the upper bonding metals 571c and 572c in the cell region CELL, and the upper bonding metals 571c and 572c may be connected to lower bonding metals 671c and 672c that are connected to the circuit elements 620c of the page buffer 593. Therefore, the page buffer 593 may be connected to the bit line 560c through upper bonding metals 571c and 572c and lower bonding metals 671c and 672c. In an example embodiment, the page buffer 593 may correspond to the page buffer described above with reference to FIGS. 1 to 16. The defect detection circuit described with reference to FIGS. 1 to 16 may be further disposed in the bit line bonding area BLBA. For example, the page buffer circuit may be controlled based on pre-sensing signals and post-sensing signals different from each other. The defect detection circuit may control the page buffer based on different signal timings.

In the word line bonding area WLBA, the word lines 530 may extend in the first direction D1 parallel to the top surface of the second substrate 510 and may be connected to a plurality of cell contact plugs 541 to 547 and 540. The word lines 530 and the cell contact plugs 540 may be connected to each other by pads provided by at least some of the word lines 530 extending to different lengths in the first direction D1. A first metal layer 550b and a second metal layer 560b may be sequentially connected to the top of the cell contact plugs 540 connected to the word lines 530. In the word line bonding area WLBA, the cell contact plugs 540 may be connected to the peripheral circuit region PERI through the upper bonding metals 571b and 572b in the cell region CELL and the lower bonding metals 671b and 672b in the peripheral circuit region PERI.

The cell contact plugs 540 may be electrically connected to the circuit elements 620b that provide a row decoder 594 in the peripheral circuit region PERI. In an example embodiment, an operating voltage of the circuit elements 620b providing the row decoder 594 may be different from an operating voltage of the circuit elements 620c providing the page buffer 593. For example, the operating voltage of the circuit elements 620c providing the page buffer 593 may be greater than the operating voltage of the circuit elements 620b providing the row decoder 594.

A common source line contact plug 580 may be provided in the external pad bonding area PA. The common source line contact plug 580 includes a conductive material like a metal, a metal compound, or polysilicon and may be electrically connected to the common source line 520. A first metal layer 550a and a second metal layer 560a may be sequentially stacked on the common source line contact plug 580. For example, an area in which the common source line contact plug 580, the first metal layer 550a, and the second metal layer 560a are arranged may be defined as the external pad bonding area PA.

Input/output pads 505 and 605 may be arranged in the external pad bonding area PA. A lower insulation film 601 covering the bottom surface of the first substrate 610 may be formed under the first substrate 610, and a first input/output pad 605 may be formed on the lower insulation film 601. The first input/output pad 605 is connected to at least one of the circuit elements 620a, 620b, and 620c arranged in the peripheral circuit region PERI through a first input/output contact plug 603 and may be separated from the first substrate 610 by a lower insulation film 601. Also, a side insulation film may be provided between the first input/output contact plug 603 and the first substrate 610 to electrically separate the first input/output contact plug 603 from the first substrate 610.

An upper insulation film 501 covering the top surface of the second substrate 510 may be formed on the second substrate 510, and a second input/output pad 505 may be provided on the upper insulation film 501. The second input/output pad 505 may be connected to at least one of the circuit elements 620a, 620b, and 620c arranged in the peripheral circuit region PERI through a second input/output contact plug 503.

According to example embodiments, the second substrate 510 and the common source line 520 may not be arranged in an area where the second input/output contact plug 503 is provided. Also, the second input/output pad 505 may not overlap the word lines 530 in the third direction (Z-axis direction). The second input/output contact plug 503 is separated from the second substrate 510 in a direction parallel to the top surface of the second substrate 510 and may penetrate through an interlayer insulation layer in the cell region CELL and be connected to the second input/output pad 505.

According to example embodiments, the first input/output pad 605 and the second input/output pad 505 may be selectively formed. For example, the memory device 20 may include only the first input/output pad 605 provided on the first substrate 610 or only the second input/output pad 505 provided on the second substrate 510. Alternatively, the memory device 20 may include both the first input/output pad 605 and the second input/output pad 505.

In each of the external pad bonding area PA and the bit line bonding area BLBA included in each of the cell region CELL and the peripheral circuit region PERI, a metal pattern of an uppermost metal layer may exist as a dummy pattern or the uppermost metal layer may be omitted.

In the memory device 20, in the external pad bonding area PA, in correspondence to an upper metal pattern 572a formed on the uppermost metal layer in the cell region CELL, a lower metal pattern 673a having the same shape as the upper metal pattern 572a may be formed on the uppermost metal layer in the peripheral circuit region PERI. The lower metal pattern 673a formed on the uppermost metal layer in the peripheral circuit region PERI may not be connected to a separate contact in the peripheral circuit region PERI. Similarly, in the external pad bonding area PA, in correspondence to a lower metal pattern formed on the uppermost metal layer in the peripheral circuit region PERI, an upper metal pattern having the same shape as the lower metal pattern in the peripheral circuit region PERI may be formed on the uppermost metal layer in the cell region CELL.

Lower bonding metals 471b and 472b may be formed on the second metal layer 640b in the word line bonding area WLBA. In the word line bonding area WLBA, the lower bonding metals 671b and 672b in the peripheral circuit region PERI may be electrically connected to upper bonding metals 571b and 572b in the cell region CELL through bonding.

Also, in the bit line bonding area BLBA, in correspondence to a lower metal pattern 652 formed on the uppermost metal layer in the peripheral circuit region PERI, an upper metal pattern 592 having the same shape as the metal pattern 652 may be formed on the uppermost metal layer in the cell region CELL. A contact may not be formed on the upper metal pattern 592 formed on the uppermost metal layer in the cell region CELL.

While aspects of example embodiments have been particularly shown and described, it will be understood that various changes in form and details may be made therein without departing from the spirit and scope of the following claims.

What is claimed is:

1. A non-volatile memory device comprising:
a memory cell array comprising a plurality of cell strings, each comprising a plurality of memory cells respectively connected to a plurality of word lines;
a page buffer circuit comprising a plurality of page buffers respectively connected to the plurality of memory cells through a plurality of bit lines, wherein a first page buffer from among the plurality of page buffers is connected to a first cell string from among the plurality of cell strings through a first bit line from among the plurality of bit lines;
a control logic circuit configured to control a pre-sensing operation to disconnect the first bit line and the first cell string from each other during a pre-sensing period for detecting a defect of the first bit line and control a post-sensing operation to connect the first bit line and the first cell string to each other in a post-sensing period for detecting defects of the plurality of word lines and the first bit line; and
a defect detection circuit configured to detect defects of the plurality of word lines based on a result of the pre-sensing operation and a result of the post-sensing operation.

2. The non-volatile memory device claim 1, wherein the defect detection circuit comprises:
a first counter circuit configured to obtain a first result value by counting a number of off-cells according to the result of the pre-sensing operation;
a second counter circuit configured to obtain a second result value by counting a number of off-cells according to the result of the post-sensing operation; and
a comparison circuit configured to compare the first result value with the second result value.

3. The non-volatile memory device claim 2, wherein the defect detection circuit is further configured to transmit a defect detection completion signal to block the memory cell array based on the second result value being equal to or greater than the first result value.

4. The non-volatile memory device claim 1, wherein a setup starting time point of the pre-sensing operation is earlier than a setup starting time point of the post-sensing operation.

5. The non-volatile memory device claim 1, wherein the first page buffer comprises a first shut-off transistor for controlling an electrical connection between a sensing node and the first bit line and a first shield transistor for controlling an electrical connection between the first bit line and ground, and
wherein a bit line shut-off signal is provided to a gate of the first shut-off transistor and a bit line shield signal is provided to a gate of the first shield transistor.

6. The non-volatile memory device claim 5, wherein, in a first period of the pre-sensing period, the bit line shut-off signal and the bit line shield signal are controlled to rise to a first level, and
wherein the defect detection circuit is further configured to detect a defect of the first bit line based on a voltage of the first bit line becoming a second level in a second period of the pre-sensing period different from the first period.

7. The non-volatile memory device claim 5, wherein, in a first period of the pre-sensing period, the bit line shut-off signal and the bit line shield signal are controlled to rise to a first level, and
wherein the defect detection circuit is further configured to detect a defect of the first bit line based on a voltage of the first bit line becoming a second level in the first period.

8. The non-volatile memory device claim 5, wherein, in a first period of the post-sensing period, the bit line shut-off signal, the bit line shield signal, and a string select line are controlled to rise to a first level, and
wherein the defect detection circuit is further configured to detect a defect of the first bit line and at least one of the plurality of word lines based on a voltage of the first bit line becoming a second level in a second period of the post-sensing period different from the first period.

9. The non-volatile memory device claim 5, wherein the defect detection circuit is further configured to simultaneously detect a defect of the first bit line and at least one of the plurality of word lines based on a bit line shut-off signal and the voltage of the first bit line rising to a first level in a first period of the post-sensing period.

10. A non-volatile memory device comprising:
a memory cell array provided in a first semiconductor layer and comprising a plurality of cell strings, each comprising a plurality of memory cells respectively connected to a plurality of word lines;
a page buffer circuit provided in a second semiconductor layer and connected to each of a plurality of bit lines via through electrodes penetrating the first semiconductor layer and the second semiconductor layer, wherein the first semiconductor layer is provided on the second semiconductor layer;
a control logic circuit provided in the second semiconductor layer, and configured to control a pre-sensing operation to disconnect the plurality of bit lines and the plurality of cell strings from each other during a pre-sensing period for detecting a defect of at least one of the plurality of bit lines and control a post-sensing operation to connect the plurality of bit lines and the plurality of cell strings in a post-sensing period for detecting defects of at least one of the plurality of word lines and the plurality of bit lines; and
a defect detection circuit provided in the second semiconductor layer and configured to detect defects of the plurality of word lines based on a result of the pre-sensing operation and a result of the post-sensing operation.

11. The non-volatile memory device of claim 10, wherein the through electrodes are respectively connected to the plurality of bit lines through upper contacts of the first semiconductor layer and are connected to the page buffer circuit through lower conductive lines of the second semiconductor layer.

12. The non-volatile memory device of claim 10, wherein the defect detection circuit comprises:
a first counter circuit configured to obtain a first result value based on a number of off-cells of the pre-sensing operation;

a second counter circuit configured to obtain a second result value based on a number of off-cells of the post-sensing operation; and a comparison circuit configured to compare the first result value and the second result value.

13. The non-volatile memory device of claim 12, wherein the non-volatile memory device is configured to block the memory cell array based on the second result value being equal to or greater than the first result value.

14. The non-volatile memory device of claim 10, wherein a setup starting time point of the pre-sensing operation is earlier than a setup starting time point of the post-sensing operation.

15. The non-volatile memory device of claim 10, wherein the page buffer circuit comprises a shut-off transistor configured to control an electrical connection between a sensing node and the plurality of bit lines and a shield transistor configured to control an electrical connection between the plurality of bit lines and ground, and wherein a bit line shut-off signal is provided to a gate of the shut-off transistor and a bit line shield signal is provided to a gate of the shield transistor.

16. The non-volatile memory device of claim 15, wherein, in a first period of the pre-sensing period, the bit line shut-off signal and the bit line shield signal controlled to rise to a first level, and wherein the defect detection circuit is further configured to detect a defect of the plurality of bit lines based on a voltage of the plurality of bit lines becoming a second level in a second period of the pre-sensing period different from the first period.

17. The non-volatile memory device of claim 15, wherein, in a first period of the pre-sensing period, the bit line shut-off signal and the bit line shield signal are controlled to rise to a first level, and wherein the defect detection circuit is further configured to detect a defect of the plurality of bit lines based on a voltage of the plurality of bit lines becoming a second level in the first period.

18. The non-volatile memory device of claim 15, wherein, in a first period of the post-sensing period, the bit line shut-off signal, the bit line shield signal, and a string select line are controlled to rise to a first level, and wherein the defect detection circuit is further configured to simultaneously detect a defect of the plurality of bit lines and the plurality of word lines based on a voltage of the plurality of bit lines becoming a second level in a second period of the post-sensing period different from the first period.

19. The non-volatile memory device of claim 15, wherein the defect detection circuit is further configured to simultaneously detect a defect of the plurality of bit lines and the plurality of word lines based on a bit line shut-off signal and the voltage of the plurality of bit lines rising to a first level in a first period of the post-sensing period.

20. A non-volatile memory device comprising:

a memory cell array comprising a first memory cell connected to a first word line and a second memory cell connected to a second word line;

a page buffer circuit comprising a first page buffer connected to the first memory cell and a first cell string through a first bit line, and a second page buffer connected to the second memory cell and a second cell string through a second bit line;

a control logic circuit configured to control a pre-sensing operation to disconnect the first bit line and the first cell string from each other during a pre-sensing period for detecting a defect of the first bit line and control a post-sensing operation to connect the first bit line and the first cell string in a post-sensing period for detecting defects of the first word line and the first bit line; and a defect detection circuit configured to detect defects of the first word line based on a result of the pre-sensing operation and a result of the post-sensing operation.

* * * * *